US011854850B2

(12) United States Patent
Kaga et al.

(10) Patent No.: US 11,854,850 B2
(45) **Date of Patent: *Dec. 26, 2023**

(54) SUBSTRATE PROCESSING APPARATUS, METHOD OF MANUFACTURING SEMICONDUCTOR DEVICE, METHOD OF LOADING SUBSTRATE AND NON-TRANSITORY COMPUTER-READABLE RECORDING MEDIUM

(71) Applicant: Kokusai Electric Corporation, Tokyo (JP)

(72) Inventors: Yukinao Kaga, Toyama (JP); Ryosuke Yoshida, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 748 days.

This patent is subject to a terminal disclaimer.

(21) Appl. No.: 16/725,460

(22) Filed: Dec. 23, 2019

(65) Prior Publication Data

US 2020/0144082 A1 May 7, 2020

Related U.S. Application Data

(63) Continuation of application No. 16/059,760, filed on Aug. 9, 2018, now Pat. No. 10,559,485, which is a (Continued)

(51) Int. Cl.

*H01L 21/67* (2006.01)
*H01L 21/677* (2006.01)

(Continued)

(52) U.S. Cl.

CPC .......... *H01L 21/6776* (2013.01); *C23C 16/34* (2013.01); *C23C 16/4583* (2013.01);

(Continued)

(58) Field of Classification Search

CPC ............. H01L 21/6776; H01L 21/0228; H01L 21/67017; H01L 21/67109;

(Continued)

(56) References Cited

U.S. PATENT DOCUMENTS 8,664,013 B2 * 3/2014 Takenaga ................ C23C 16/24 700/121
8,809,206 B2 * 8/2014 Sugino .................. C23C 16/045 438/787

(Continued)

FOREIGN PATENT DOCUMENTS

JP 2003051497 A 2/2003
JP 2004-22987 A 1/2004

(Continued)

OTHER PUBLICATIONS

International Search Report in corresponding PCT Application No. PCT/JP2016/060652, dated Jul. 5, 2016, with English translation.

(Continued)

*Primary Examiner* — Mohammed Shamsuzzaman
(74) *Attorney, Agent, or Firm* — Edell, Shapiro & Finnan, LLC

(57) ABSTRACT

Described herein is a technique capable of improving the controllability of a thickness of a film formed on a large surface area substrate having a surface area greater than a surface area of a bare substrate and improving the thickness uniformity between films formed on a plurality of large surface area substrates accommodated in a substrate loading region by reducing the influence of the surface area of the large surface area substrate and the number of the large surface area substrates due to a loading effect even when the plurality of large surface area substrates are batch-processed using a batch type processing furnace.

13 Claims, 22 Drawing Sheets

TOP
SLOT #100
SLOT #75
600
SLOT #50
SLOT #25
601
603
602
SLOT #1
BOTTOM

Related U.S. Application Data continuation of application No. PCT/JP2016/060652, filed on Mar. 31, 2016.

(51) Int. Cl.

| | |
|---|---|
| ***C23C 16/458*** | (2006.01) |
| ***C23C 16/455*** | (2006.01) |
| ***C23C 16/34*** | (2006.01) |
| ***H01L 21/02*** | (2006.01) |
| *H01L 21/66* | (2006.01) |

(52) U.S. Cl.

CPC .... *C23C 16/45544* (2013.01); *H01L 21/0228* (2013.01); *H01L 21/677* (2013.01); *H01L 21/67017* (2013.01); *H01L 21/67109* (2013.01); *H01L 21/67253* (2013.01); *H01L 21/67757* (2013.01); *H01L 21/67778* (2013.01); *H01L 21/0262* (2013.01); *H01L 22/12* (2013.01)

(58) Field of Classification Search

CPC ............ H01L 21/67253; H01L 21/677; H01L 21/67757; H01L 21/67778; H01L 21/0262; H01L 22/12; C23C 16/34; C23C 16/45544; C23C 16/4583

See application file for complete search history.

(56) References Cited

U.S. PATENT DOCUMENTS

| | | | | |
|---|---|---|---|---|
| 10,236,223 | B2 * | 3/2019 | Takenaga .......... | H01L 21/67253 |
| 2004/0238519 | A1 * | 12/2004 | Sakamoto .............. | F27D 19/00 219/390 |
| 2005/0180844 | A1 * | 8/2005 | Uekert .................. | G01R 31/01 414/788.1 |
| 2011/0033638 | A1 * | 2/2011 | Ponnekanti ............ | C23C 16/52 118/723 E |
| 2015/0376789 | A1 * | 12/2015 | Motoyama .......... | H01L 21/0228 118/725 |
| 2016/0025414 | A1 * | 1/2016 | Wu .................. | H01L 21/67778 700/121 |
| 2018/0286767 | A1 * | 10/2018 | Takenaga ............ | G05B 19/188 |
| 2020/0144082 | A1 | 5/2020 | Kaga et al. | |

FOREIGN PATENT DOCUMENTS

| | | | |
|---|---|---|---|
| JP | 2004104014 | A | 4/2004 |
| JP | 2006-190760 | A | 7/2006 |
| JP | 2007-527003 | A | 9/2007 |
| JP | 2008-66429 | A | 3/2008 |
| JP | 2012-33619 | A | 2/2012 |
| JP | 2015173154 | A | 10/2015 |
| WO | 2017168675 | A1 | 10/2017 |

OTHER PUBLICATIONS

Office Action in corresponding Japanese Patent Application No. 2019-107737, dated Apr. 17, 2020, with English ranslation.

* cited by examiner

SUBSTRATE PROCESSING APPARATUS, METHOD OF MANUFACTURING SEMICONDUCTOR DEVICE, METHOD OF LOADING SUBSTRATE AND NON-TRANSITORY COMPUTER-READABLE RECORDING MEDIUM

CROSS REFERENCE TO RELATED APPLICATIONS

This application is a continuation of U.S. patent application Ser. No. 16/059,760 filed Aug. 9, 2018, which is a continuation of International Application No. PCT/JP2016/060652, filed on Mar. 31, 2016, the entire contents of which are hereby incorporated by reference.

TECHNICAL FIELD

The present disclosure relates to a method of manufacturing a semiconductor device, a method of loading a substrate, and a non-transitory computer-readable recording medium.

BACKGROUND

Recently, a surface area of a semiconductor device has been steadily increasing due to high integration and three-dimensional structure of the semiconductor device. In a semiconductor manufacturing process, a so-called loading effect such as a change in thickness of a film formed on a substrate due to an increased surface area of the semiconductor device becomes a serious problem. Thus, a film forming technique for suppressing an influence of the loading effect is required. As a method for coping with such a demand, there is a method of forming a film by alternately supplying process gases onto a substrate.

The method of forming the film by alternately supplying the process gases is effective for suppressing the loading effect. Recently, a substrate having a surface area at least three times of that of a bare substrate may be used. The term "surface area" throughout this specification means the total area of all the outside surfaces of three dimensional shapes (such as patterns) formed on the upper surface of a substrate. The bare substrate refers to a substrate that no pattern is formed thereon. Hereinafter, the substrate whose surface area is at least three times of that of the bare substrate is referred to as a "large surface area substrate". When a batch processing apparatus such as a substrate processing apparatus configured to load (charge) and process a plurality of large surface area substrates according to the above-mentioned method of forming a film by alternately supplying the process gases, a thickness of a film formed on each of the large surface area substrates may vary depending on the surface area of each of the large surface area substrates and the number of the large surface area substrates loaded in the batch processing apparatus. Therefore, it is difficult to control the thickness of the film formed on each of the large surface area substrates.

SUMMARY

Described herein is a technique capable of improving the controllability of a thickness of a film formed on a large surface area substrate having a surface area greater than a surface area of a bare substrate and improving the thickness uniformity between films formed on a plurality of large surface area substrates accommodated in a substrate loading region by reducing the influence of the surface area of the large surface area substrate and the number of the large surface area substrates due to a loading effect even when the plurality of large surface area substrates are batch-processed using a batch type processing furnace.

According to one aspect of the technique described herein, a method of manufacturing a semiconductor device may use a substrate retainer including a substrate loading region provided with a plurality of slots and capable of loading and holding a maximum of X (X is a natural number equal to or greater than 3) substrates in the plurality of slots, and may include: (a) loading Y (Y is a natural number less than X) substrates to be processed in the substrate retainer in a dispersed manner by adjusting Z (Z is a natural number) indicating a maximum number of the substrates to be processed loaded consecutively in the substrate retainer such that a density distribution of the substrates to be processed in the substrate loading region when Z is adjusted is more flattened compared with the density distribution of the substrates to be processed when Z is equal to Y; and (b) loading the substrate retainer where the Y substrates to be processed are dispersedly loaded into a process chamber and processing the Y substrates to be processed.

DETAILED DESCRIPTION

Embodiment

Figure 1:
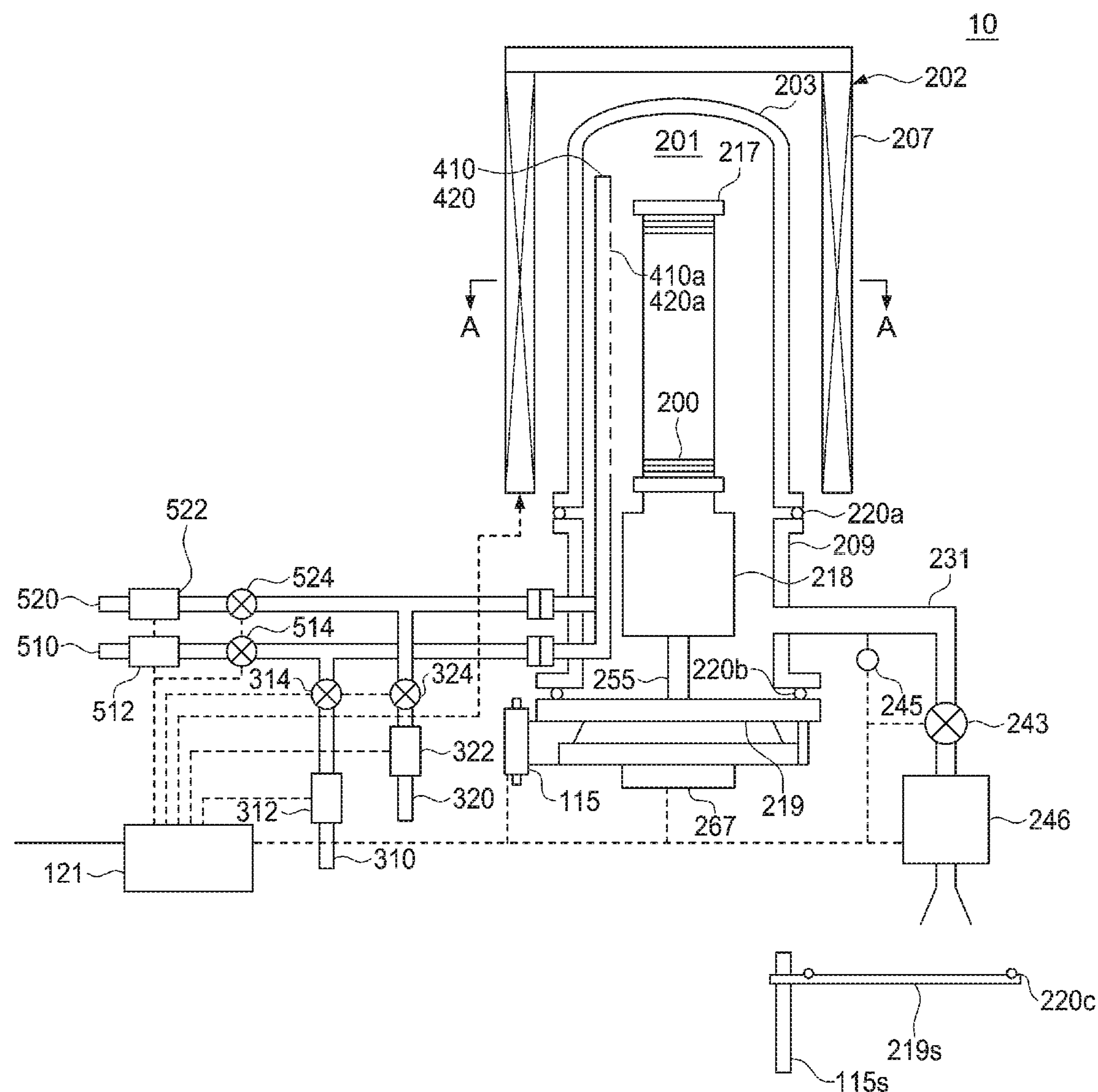
FIG. 1 schematically illustrates a vertical cross-section of a vertical type processing furnace of a substrate processing apparatus preferably used in an embodiment described herein.

Hereinafter, an embodiment will be described with reference to FIGS. 1 through 22.

Recently, a substrate having a pattern such as a stacked structure (aggregated structure) of predetermined layers or films formed on a surface of the substrate is processed due to high integration and three-dimensional structure of a semiconductor device. As described above, a substrate having a large surface area compared to that of a bare substrate (a substrate that no pattern is formed on a surface thereof) is referred to as a "large surface area substrate". For example, when the surface area of the bare substrate is 1, the surface area of the large surface area substrate is greater than 3.

A batch processing apparatus capable of batch-processing a plurality of substrates can be used for processing a plurality of large surface area substrates. When the number of the large surface area substrates is less than the maximum number of substrates that the batch processing apparatus can process in a batch, in general, the large surface area substrates are loaded (charged) collectively in a region of a substrate retainer in order to simplify a substrate transfer pattern and to shorten the transfer time required for the large surface area substrates. For example, when a vertical type batch processing apparatus capable of batch processing 100 substrates, which is an example of the batch processing apparatus, is used for processing the plurality of substrates including the plurality of large surface area substrates (for example, 5 large surface area substrates), the 5 large surface area substrates may be loaded collectively in a series of slots provided consecutively at the top portion (upper end) of the substrate retainer, or loaded collectively in a series of slots provided consecutively at the bottom portion (lower end) of the substrate retainer, or loaded collectively in a series of slots provided consecutively at the center portion of the substrate retainer. Hereinafter, the plurality of large surface area substrates is also referred to as a "group of large surface area wafers 601". When the plurality of large surface area substrates is loaded in the substrate retainer as described above, the thicknesses of the films formed on the substrates in the vicinity of the slots of the substrate retainer where the 5 large surface area substrates are loaded become thinner than the thicknesses of the films formed on the substrates in the vicinity of the slots of the substrate retainer where the 5 large surface area substrates are not loaded. That is, the thickness uniformity between the films formed on the substrates in a substrate loading region capable of loading 100 substrates may deteriorate. Also, the thicknesses of the films formed on the 5 large surface area substrates loaded in the slots provided at the center portion of the substrate retainer are smaller than the thicknesses of the films formed on the 5 large surface area substrates loaded in the slots provided at the upper end or the lower end (the top portion or the bottom portion) of the substrate retainer. That is, the thickness uniformity of films may deteriorate between different sets of 5 large surface area substrates loaded collectively.

A total surface area of the group of large surface area substrates varies with each batch according to the surface area of each large surface area substrate and the number of the large surface area substrates loaded in each batch. Thus, an average thickness of the films formed on the substrates to be processed may vary with each batch even though the cycle for alternately supplying a plurality of process gases under the same process conditions is performed the same number of times in each batch. As a result, it is difficult to control the thicknesses of the films formed on the substrates when the substrates including the large surface area substrates are processed.

The inventors of the present application have studied the problems described above and confirmed that the cause of the problems described above is that the large surface area substrates less than the maximum number of substrates that can be loaded in the batch processing apparatus are loaded collectively (consecutively) in the batch processing apparatus. Therefore, the inventors have confirmed that the problems described above can be addressed by loading (charging) the large surface area substrates in the slots of the substrate retainer in a dispersed manner. Preferably, the large surface area substrates are loaded (charged) in a proportionally dispersed manner. That is, it is preferable that a density distribution of the large surface area substrate in the substrate loading region is flattened. By flattening the density distribution of the large surface area substrate in the substrate loading region, it possible to obtain a desired thickness uniformity for the films formed on the large surface area substrates loaded in the slots of the substrate retainer. Further, it is possible to obtain a desired film thickness by automatically correcting the number of times of the cycle of alternately supplying the plurality of process gases is performed in accordance with a total surface area of the large surface area substrates (an amount of the surface area of each large surface area substrate multiplied by the number of the large surface area substrates). For example, even if the total surface area of the large surface area substrates varies in each batch, a film having a constant or nearly constant thickness can be obtained without being affected by the variation of the total surface area.

(1) Configuration of Substrate Processing Apparatus

Hereinafter, a substrate processing apparatus 10 will be described. As shown in FIG. 1, a processing furnace 202 serving as a batch type processing furnace includes a heater 207 serving as a heating apparatus (temperature adjusting mechanism). The heater 207 is cylindrical, and vertically installed while being supported by a support plate (not shown). The heater 207 also functions as an activation mechanism (excitation mechanism) for activating (exciting) a gas by heat.

A reaction tube 203 is provided in the heater 207 so as to be concentric with the heater 207. The reaction tube 203 is made of a heat-resistant material such as quartz ($SiO_2$) and silicon carbide (SiC), and cylindrical with a closed upper end and an open lower end. A manifold 209 is provided under the reaction tube 203 so as to be concentric with the reaction tube 203. The manifold 209 is made of a metal such as stainless steel (SUS), and cylindrical with open upper and lower ends. An upper end of the manifold 209 is engaged with the lower end of the reaction tube 203 so as to support the reaction tube 203. An O-ring 220*a* serving as a sealing member is provided between the manifold 209 and the reaction tube 203. Similar to the heater 207, the reaction tube 203 is vertically installed. A processing vessel (reaction vessel) is constituted by the reaction tube 203 and the manifold 209. A process chamber 201 is provided in the hollow cylindrical portion of the processing vessel. The process chamber 201 may accommodate a plurality of wafers 200 as substrates.

Nozzles 410 and 420 are provided in the process chamber 201 through sidewalls of the manifold 209. Gas supply pipes 310 and 320 serving as gas supply lines are connected to the respective nozzles 410 and 420.

Mass flow controllers (MFCs) 312 and 322 serving as flow rate controllers (flow rate control mechanisms) and valves 314 and 324 serving as opening/closing valves are sequentially installed at the gas supply pipes 310 and 320 from the upstream sides toward the downstream sides of the gas supply pipes 310 and 320, respectively. Gas supply pipes 510 and 520 for supplying an inert gas are connected to the downstream sides of the valves 314 and 324 installed at the gas supply pipes 310 and 320, respectively. MFCs 512 and 522 and valves 514 and 524 are sequentially installed at the gas supply pipes 510 and 520 from the upstream sides toward the downstream sides of the gas supply pipes 510 and 520, respectively.

Figure 2:
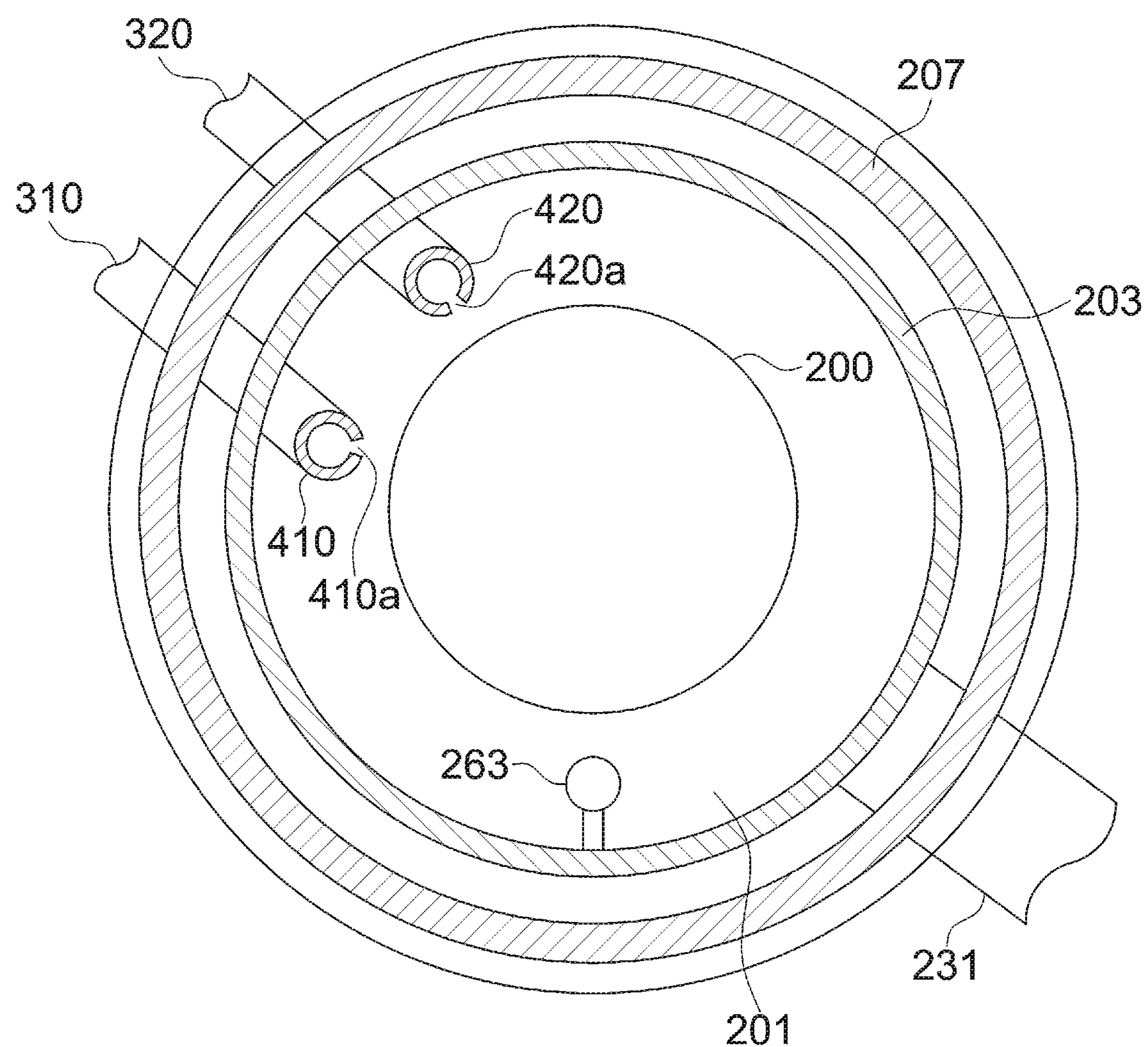
FIG. 2 schematically illustrates a cross-section taken along the line A-A of the vertical type processing furnace of the substrate processing apparatus shown in FIG. 1.

As shown in FIGS. 1 and 2, the nozzles 410 and 420 are provided in an annular space between an inner wall of the reaction tube 203 and the wafers 200, and extend from bottom to top of the inner wall of the reaction tube 203 along a stacking direction of the wafers 200. That is, the nozzles 410 and 420 are provided in a region that horizontally surrounds a wafer arrangement region at one side of the wafer arrangement region where the wafers 200 are arranged along the wafer arrangement region.

A plurality of gas supply holes 410*a* and a plurality of gas supply holes 420*a* for supplying gases are provided at side surfaces of the nozzles 410 and 420, respectively. The plurality of gas supply holes 410*a* and the plurality of gas supply holes 420*a* are open toward the center of the reaction tube 203, and configured to supply gases toward the wafers 200. The plurality of gas supply holes 410*a* and the plurality of gas supply holes 420*a* are provided from the lower portion of the reaction tube 203 to the upper portion thereof. The plurality of gas supply holes 410*a* has the same area and pitch and the plurality of gas supply holes 420*a* has the same area and pitch. However, the plurality of gas supply holes 410*a* and the plurality of gas supply holes 420*a* are not limited thereto. The opening areas of the plurality of gas supply holes 410*a* and the plurality of gas supply holes 420*a* may gradually increase from the lower portion (upstream side) toward the upper portion (downstream side) of the nozzles 410 and 420 to maintain the uniformity of the amounts of gases supplied through the plurality of gas supply holes 410*a* and the plurality of gas supply holes 420*a*, respectively.

According to the embodiment, the gases are supplied through the nozzles 410 and 420 disposed in the vertical annular space defined by the inner surface of the sidewall of the reaction tube 230 and the edges of the wafers 200 arranged in the reaction tube 203. The gases are injected into the reaction tube 203 toward the wafers 200 through the plurality of gas supply holes 410*a* of the nozzle 410 and the plurality of gas supply holes 420*a* of the nozzle 420, respectively. The gases injected into the reaction tube 203 mainly flow parallel to the surface of the wafers 200, that is, horizontally.

According to the above-described configuration, the gases are uniformly supplied to each of the wafers 200. After passing the surfaces of the wafers 200, the gases flow toward an exhaust port, that is, an exhaust pipe 231 described later. However, the flow direction of the gases may vary depending on the location of the exhaust port, and is not limited to the vertical direction.

For example, a titanium (Ti) source gas containing titanium such as titanium tetrachloride ($TiCl_4$) serving as a source gas (one of process gases) is supplied into the process chamber 201 via the gas supply pipe 310 provided with the MFC 312 and the valve 314 and the nozzle 410. Herein, the term "source" may refer to only "source in liquid state", only "source gas (source in gaseous state)" and both of "source in liquid state" and "source gas (source in gaseous state)".

For example, a nitrogen (N)-containing gas such as ammonia ($NH_3$) serving as a reactive gas (one of process gases) is supplied into the process chamber 201 via the gas supply pipe 320 provided with the MFC 322 and the valve 324 and the nozzle 420.

For example, the inert gas such as nitrogen ($N_2$) gas is supplied into the process chamber 201 via the gas supply pipes 510 and 520 provided with the MFCs 512 and 522 and the valves 514 and 524, the gas supply pipes 310 and 320 and the nozzles 410 and 420, respectively.

A source gas supply system is constituted mainly by the gas supply pipe 310, the MFC 312 and the valve 314. The source gas supply system may further include the nozzle 410. A reactive gas supply system is constituted mainly by the gas supply pipe 320, the MFC 322 and the valve 324. The reactive gas supply system may further include the nozzle 420. An inert gas supply system is constituted mainly by the gas supply pipes 510 and 520, the MFCs 512 and 522 and the valves 514 and 524. The source gas supply system and the reactive gas supply system may be collectively referred to as a gas supply system. The gas supply system may further include the inert gas supply system.

The exhaust pipe 231 serving as an exhaust flow path for exhausting the inner atmosphere of the process chamber 201 is provided at the reaction tube 203. A vacuum pump 246 serving as a vacuum exhauster is connected to the exhaust pipe 231 through a pressure sensor 245 and an APC (Automatic Pressure Controller) valve 243. The pressure sensor 245 serves as a pressure detector (pressure detection mechanism) to detect the inner pressure of the process chamber 201, and the APC valve 243 serves as an exhaust valve (pressure adjusting mechanism). With the vacuum pump 246 in operation, the APC valve 243 may be opened/closed to vacuum-exhaust the process chamber 201 or stop the vacuum exhaust. With the vacuum pump 246 in operation, the opening degree of the APC valve 243 may be adjusted based on the pressure detected by the pressure sensor 245, in order to control the inner pressure of the process chamber 201. An exhaust system is constituted mainly by the exhaust pipe 231, the APC valve 243 and the pressure sensor 245. The exhaust system may further include the vacuum pump 246.

A seal cap 219 serving as a furnace opening cover can airtightly seal the lower end opening of the manifold 209, is provided under the manifold 209. An O-ring **220*b* serving as a sealing member is provided on the upper surface of the seal cap 219 so as to be in contact with the lower end of the manifold 209. A rotating mechanism 267 to rotate a boat 217 described later is provided under the seal cap 219 opposite to the process chamber 201. The rotating mechanism 267 includes a rotating shaft 255 connected to the boat 217 through the seal cap 219. As the rotating mechanism 267 rotates the boat 217, the wafers 200 are rotated. The seal cap 219 may be moved upward/downward in the vertical direction by a boat elevator 115 provided outside the reaction tube 203 vertically. The boat elevator 115 serves as an elevating mechanism. When the seal cap 219 is moved upward/downward by the boat elevator 115, the boat 217 may be loaded into the process chamber 201 or unloaded out of the process chamber 201. The boat elevator 115 serves as a transfer device (transfer mechanism) that loads the boat 217, that is, the wafers 200 into the process chamber 201 or unloads the boat 217, that is, the wafers 200 out of the process chamber 201. A shutter 219*s* is provided under the manifold 209. The shutter 219*s* serves as a furnace opening cover can airtightly seal the lower end opening of the manifold 209 while the seal cap 219 is moved downward by the boat elevator 115. An O-ring 220*c* serving as a sealing member is provided on the upper surface of the shutter 219*s* so as to be in contact with the lower end of the manifold 209. The opening/closing operations of the shutter 219*s* such as the elevation and the rotation is controlled by a shutter opening/closing mechanism 115*s***.

The boat 217 serving as the substrate retainer aligns wafers 200, for example, from 5 to 200 wafers 200 in the vertical direction and supports the wafers 200, while the wafers 200 are horizontally positioned and centered with each other. That is, the boat 217 supports (accommodates) the wafers 200 with predetermined intervals therebetween. The boat 217 is made of a heat-resistant material such as quartz and SiC. An insulating plate is provided in multiple stages under the boat 217. The insulating plate (not shown) is made of a heat-resistant material such as quartz and SiC.

A wafer loading region 600 will be described with reference to FIG. 4. The wafer loading region 600 serving as the substrate loading region refers to a region of the boat 217 where the wafers 200 are loaded (charged or accommodated). When the wafers 200 accommodated in the boat 217 are processed, process performances may be different between a first set of wafers accommodated in the vicinity of the upper and lower end portions of the boat 217 and a second set of wafers accommodated in the vicinity of the center portion of the boat 217. For example, in a film-forming apparatus serving as the substrate processing apparatus 10, the thickness uniformity of the films formed on the surfaces of the wafers may be different between the first set of wafers and the second set of wafers. Further, the average thickness of the films formed on the surfaces of the wafers may also be different between the first set of wafers and the second set of wafers, or the thickness uniformity of films between the surfaces of the wafers may be deteriorated. For example, when no side dummy wafer (not shown) serving as a side dummy substrate is loaded in the substrate retainer, the center portion of the wafers loaded in the both ends of the boat 217 tends to be cooler than the periphery of the wafers loaded in the both ends of the boat 217. Thus, the thickness of the film formed on the center portion of the wafers loaded in the both ends of the boat 217 is reduced and the thickness uniformity between the films formed on the surfaces of the wafers 200 may deteriorate. In order to achieve a predetermined thickness uniformity of films between the surfaces of the substrates, side dummy wafers (not shown) are loaded in the vicinity of both ends of the boat 217 and the wafers 200 to be processed are loaded between the side dummy wafers provided in the vicinity of both ends of the boat 217. The side dummy wafer region (not shown) where the side dummy wafers are loaded is not included in the wafer loading region 600. For example, when the boats 217 can accommodate a total of 115 wafers 200, that is, when the boats 217 includes 115 slots (not shown) for loading the wafers 200, and a total of 15 side dummy wafers are loaded in the slots provided at the upper and lower ends of the boats 217, for example, 5 side dummy wafers are loaded in the slots provided at one end of the boats 217 and 10 side dummy wafers are loaded in the slots provided at the other end of the boats 217, then, the total number of slots included in the wafer loading region 600 is 100. The wafers 200 loaded in the wafer loading region 600 include the large surface area wafers 601 serving as product wafers, monitor wafers 602 and fill-dummy wafers 603. The large surface area wafers 601 are also referred to as large surface area substrates, the monitor wafers 602 are also referred to as monitor substrates and the fill-dummy wafers 602 are also referred to as fill-dummy substrates. Wafers such as the monitor wafers 602 and the fill-dummy wafers 603 may be loaded in slots where the large surface area wafers 601 are not loaded. However, the slots where the large surface area wafers 601 are not loaded may remain empty without loading the wafers such as the monitor wafers 602 and the fill-dummy wafers 603.

A temperature sensor 263 serving as a temperature detector is provided in the reaction tube 203. The state of electricity conducted to the heater 207 is adjusted based on the temperature detected by the temperature sensor 263, such that the internal temperature of the process chamber 201 has a desired temperature distribution. Similar to the nozzles 410 and 420, the temperature sensor 263 is L-shaped and provided along the inner wall of the reaction tube 203.

Figure 3:
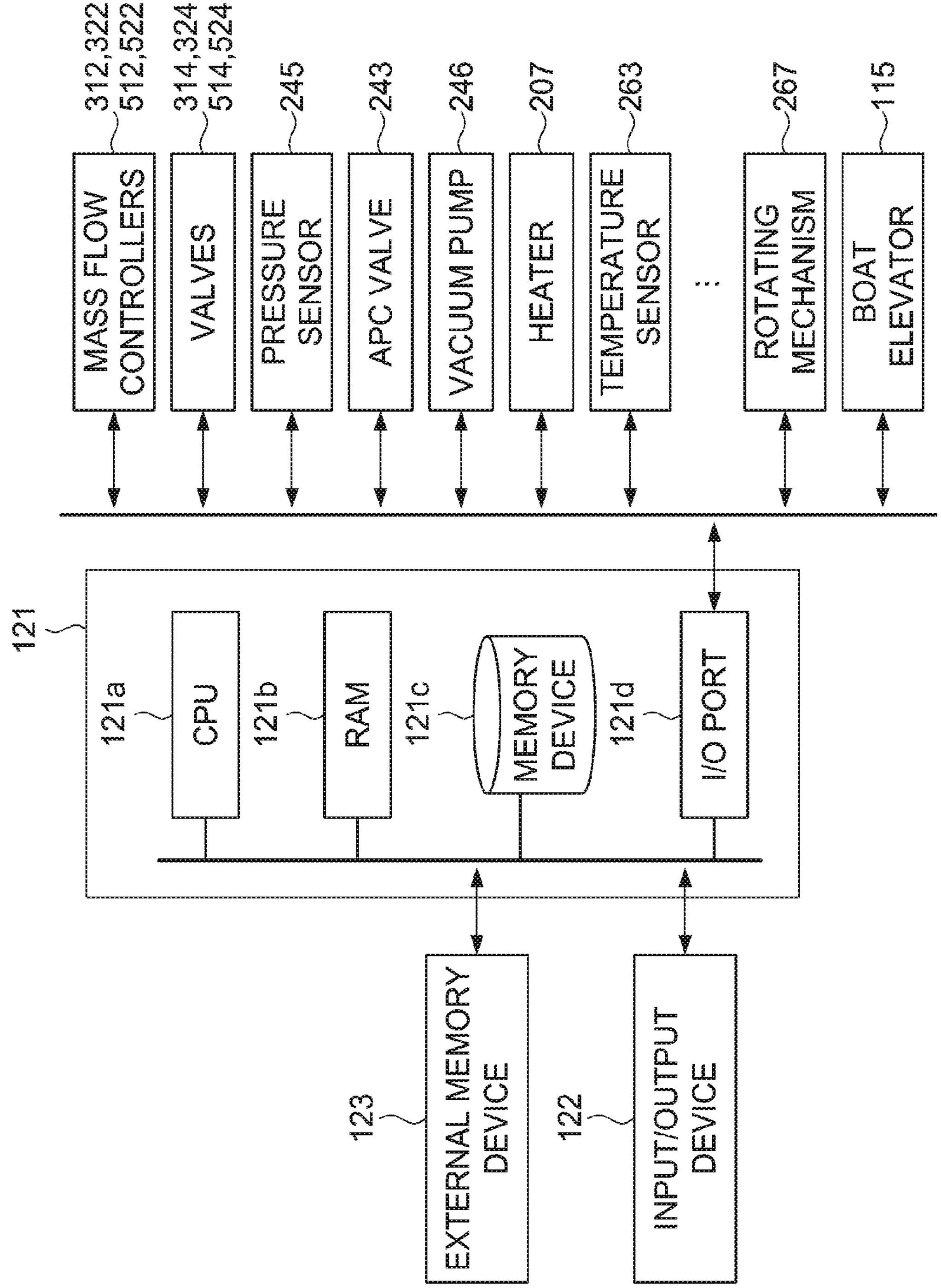
FIG. 3 is a block diagram schematically illustrating a configuration of a controller and components controlled by the controller of the substrate processing apparatus preferably used in the embodiment.

As shown in FIG. 3, a controller 121 serving as the control device (control mechanism) is constituted by a computer including a CPU (Central Processing Unit) 121*a*, a RAM (Random Access Memory) 121*b*, a memory device 121*c* and an I/O port 121*d*. The RAM 121*b*, the memory device 121*c* and the I/O port 121*d* may exchange data with the CPU 121*a* through an internal bus 121*e*. For example, an input/output device 122 such as a touch panel is connected to the controller 121.

The memory device 121*c* is configured by components such as a flash memory and HDD (Hard Disk Drive). A control program for controlling the operation of the substrate processing apparatus 10 or a process recipe containing information on the sequence and conditions of a substrate processing described later is readably stored in the memory device 121*c*. The process recipe is obtained by combining steps of a film-forming process (substrate processing) described later such that the controller 121 can execute the steps to acquire a predetermine result, and functions as a program. Hereafter, the process recipe and the control program are collectively referred to as a program. The process recipe is simply referred to as a recipe. In this specification, "program" may indicate only the recipe, indicate only the control program, or indicate both of them. The RAM 121*b* is a work area where a program or data read by the CPU 121*a* is temporarily stored.

The I/O port 121*d* is connected to the above-described components such as the MFCs 512, 522, 312 and 322, the valves 514, 524, 314 and 324, the pressure sensor 245, the APC valve 243, the vacuum pump 246, the temperature sensor 263, the heater 207, the rotating mechanism 267, the boat elevator 115 and the shutter opening/closing mechanism 115*s*.

The CPU 121*a* is configured to read a control program from the memory device 121*c* and execute the read control program. Furthermore, the CPU 121*a* is configured to read a recipe from the memory device 121*c* according to an operation command inputted from the input/output device 122. According to the contents of the read recipe, the CPU 121*a* may be configured to control various operations such as flow rate adjusting operations for various gases by the MFCs 512, 522, 312 and 322, opening/closing operations of the valves 514, 524, 314 and 324, an opening/closing operation of the APC valve 243, a pressure adjusting operation by the APC valve 243 based on the pressure sensor 245, a start and stop of the vacuum pump 246, a temperature adjusting operation of the heater 207 based on the temperature sensor 263, an operation of rotating and adjusting rotation speed of the boat 217 by the rotating mechanism 267, an elevating operation of the boat 217 by the boat elevator 115, and an opening/closing operation of the shutter 219*s* by the shutter opening/closing mechanism 115*s*.

The controller 121 may be embodied by installing the above-described program stored in an external memory device 123 into a computer. For example, the external memory device 123 may include a magnetic tape, a magnetic disk such as a flexible disk and a hard disk, an optical disk such as a CD and a DVD, a magneto-optical disk such as MO, and a semiconductor memory such as a USB memory and a memory card. The memory device 121*c* or the external memory device 123 may be embodied by a non-transitory computer readable recording medium. Hereafter, the memory device 121*c* and the external memory device 123 are collectively referred to as recording media. In this specification, "recording media" may indicate only the memory device 121*c*, indicate only the external memory device 123, and indicate both of the memory device 121*c* and the external memory device 123. Instead of the external memory device 123, a communication means such as the Internet and dedicated line may be used for providing a program to a computer.

(2) Substrate Loading

Next, a dispersed loading (dispersed charging) of the wafers 200 into the wafer loading region 600 will now be described.

In this specification, "dispersed loading", "loading dispersedly" or "loading in a dispersed manner" refer to loading the large surface area wafers 601 (the group of the large surface area wafers 601) in the boat 217 by dividing the group of the large surface area wafers 601 into at least two subgroups of the large surface area wafers and loading the at least two subgroups in the slots of the boat 2170 while providing, between the at least two subgroups, at least one slot where no large surface area wafer 601 is loaded. According to the dispersed loading described above, the group of the large surface area wafers 601 are not loaded collectively (consecutively) in the consecutive slots of the boat 217. However, the large surface area wafers 601 included in the same subgroup may be loaded collectively (consecutively) in the consecutive slots of the boat 217. Further, the minimum number of wafers in the subgroups of the large surface area wafers 601 may be one.

In the embodiment, when the batch processing apparatus provided with the wafer loading region 600 capable of loading X number of wafers (herein, X is a natural number equal to or greater than 3) loads and processes less than X number of large surface area wafers 601, the large surface area wafers 601 less than X are loaded in the wafer loading region 600 in a dispersed manner. As a result, a density distribution of the large surface area substrate indicating a loading density of the large surface area wafers 601 in each slot of the wafer loading region 600 can be flattened and the thickness uniformity between the films formed on the wafers 200 including the large surface area wafers 601 can be improved. Hereinafter, the large surface area substrate density is also referred to as a "LAD". In the specification, a value indicating a uniformity of the LAD (the large surface area substrate density) in the wafer loading region 600 is defined as a uniformity of the density distribution of large surface area substrate. Hereinafter, the uniformity of the LAD is also referred to as a "ULAD". In the embodiment, when $25 \leq X \leq 200$, the ULAD value is calculated based on an average of the LAD values, wherein a LAD value for a given slot is defined as, for example, the density of large surface area substrates loaded in a total of 11 slots including the given slot and 10 slots closest to the given slot. When $11 \leq X \leq 24$, the ULAD value is calculated based on an average of the LAD values, wherein a LAD value for a given slot is defined as, for example, the density of large surface area substrates loaded in a total of 5 slots including the given slot and 4 slots closest to the given slot. When 5≤X≤10, the ULAD value is calculated based on an average of the LAD values, wherein a LAD value for a given slot is defined as, for example, the density of large surface area substrates loaded in a total of 3 slots including the given slot and 2 slots closest to the given slot. In each of the above-described cases, the large surface area wafers 601 are loaded dispersedly such that the ULAD value when the large surface area wafers 601 are loaded dispersedly is less than the ULAD value when the large surface area wafers 601 are loaded not dispersedly (that is, when the large surface area wafers 601 are loaded collectively). Thus, the LAD distribution in the wafer loading region 600 can be further flattened.

Hereinafter, equations for calculating the LAD in the present specification are described. Assume that a total number of the slots provided in the wafer loading region 600 is X. As described above, X is a natural number equal to or greater than three and represents the maximum number of the wafers 200 can be loaded (charged) in the wafer loading region 600 of the boat 217. A slot provided at the lowermost of the wafer loading region 600 of the boat 217 is referred to a slot #1. A slot provided at the uppermost of the wafer loading region 600 of the boat 217 is referred to a slot #X. A slot provided immediately above the slot #1 is referred to as a slot #2. A slot provided immediately below the slot #X is referred to as a slot #(X−1). In this manner, each slot in the wafer loading region 600 is denoted. In the equations below, "$LA_n$" refers to a determination value for a slot #n which indicates whether or not a large surface area wafer 601 exists in the slot #n, and "$LAD_n$" refers to the LAD value for the slot #n where n is a natural number equal to or less than X. The value of the $LA_n$ is 1 when the large surface area wafer 601 is loaded in the slot #n, and zero (0) when the large surface area wafer 601 is not loaded in the slot #n <When 25≤X≤200>

When 25≤X≤200, that is, when X is equal to or greater than 25 and equal to or less than 200, the LAD value for the slot #n ($LAD_n$) is calculated as follows. When n is from 1 to 6, that is, when n is equal to or greater than 1 and equal to or less than 6, the $LAD_n$ is expressed as Equation 1 below by an average of determination values of a total of 11 slots, that is, from the slot #1 to the slot #11.

$$LAD_n=(LA_1+LA_2+LA_3+LA_4+LA_5+LA_6+LA_7+LA_8+LA_9+LA_{10}+LA_{11})/11 \quad \text{[Equation 1]}$$

When n is from 7 to (X−6), that is, when n is equal to or greater than 7 and equal to or less than (X−6), the $LAD_n$ is expressed as Equation 2 below by an average of the determination values of a total of 11 slots, that is, from the slot #(n−5) to the slot #(n+5).

$$LAD_n=(LA_{n-5}+LA_{n-4}+LA_{n-3}+LA_{n-2}+LA_{n-1}+LA_n+LA_{n+1}+LA_{n+2}+LA_{n+3}+LA_{n+4}+LA_{n+5})/11 \quad \text{[Equation 2]}$$

When n is from (X−5) to X, that is, when n is equal to or greater than (X−5) and equal to or less than X, the $LAD_n$ is expressed as Equation 3 below by an average of the determination values of a total of 11 slots, that is, from the slot #(X−10) to the slot #X.

$$LAD_n=(LA_{X-10}+LA_{X-9}+LA_{X-8}+LA_{X-7}+LA_{X-6}+LA_{X-5}+LA_{X-4}+LA_{X-3}+LA_{X-2}+LA_{X-1}+LA_X)/11 \quad \text{[Equation 3]}$$

<When 11≤X≤24>

When 11≤X≤24, that is, when X is equal to or greater than 11 and equal to or less than 24, the LAD value for the slot #n is calculated as follows. When n is from 1 to 3, that is, when n is equal to or greater than 1 and equal to or less than 3, the $LAD_n$ is expressed as Equation 4 below by an average of the determination values of a total of 5 slots, that is, from the slot #1 to the slot #5.

$$LAD_n=(LA_1+LA_2+LA_3+LA_4+LA_5)/5 \quad \text{[Equation 4]}$$

When n is from 4 to (X−3), that is, when n is equal to or greater than 4 and equal to or less than (X−3), the $LAD_n$ is expressed as Equation 5 below by an average of the determination values of a total of 5 slots, that is, from the slot #(n−2) to the slot #(n+2).

$$LAD_n=(LA_{n-2}+LA_{n-1}+LA_n+LA_{n+1}+LA_{n+2})/5 \quad \text{[Equation 5]}$$

When n is from (X−2) to X, that is, when n is equal to or greater than (X−2) and equal to or less than X, the $LAD_n$ is expressed as Equation 6 below by an average of the determination values of a total of 5 slots, that is, from the slot #(X−4) to the slot #X.

$$LAD_n=(LA_{X-4}+LA_{X-3}+LA_{X-2}+LA_{X-1}+LA_X)/5 \quad \text{[Equation 6]}$$

<When 5≤X≤10>

When 5≤X≤10, that is, when X is equal to or greater than 5 and equal to or less than 10, the LAD value for the slot #n is calculated as follows. When n is from 1 to 2, that is, when n is equal to or greater than 1 and equal to or less than 2, the $LAD_n$ is expressed as Equation 7 below by an average of the determination values of a total of 3 slots, that is, from the slot #1 to the slot #3.

$$LAD_n=(LA_1+LA_2+LA_3)/3 \quad \text{[Equation 7]}$$

When n is from 3 to (X−2), that is, when n is equal to or greater than 3 and equal to or less than (X−2), the $LAD_n$ is expressed as Equation 8 below by an average of the determination values of a total of 3 slots, that is, from the slot #(n−1) to the slot #(n+1).

$$LAD_n=(LA_{n-1}+LA_n+LA_{n+1})/3 \quad \text{[Equation 8]}$$

When n is from (X−1) to X, that is, when n is equal to or greater than (X−1) and equal to or less than X, the $LAD_n$ is expressed as Equation 9 below by an average of the determination values of a total of 3 slots, that is, from the slot #(X−2) to the slot #X.

$$LAD_n=(LA_{X-2}+LA_{X-1}+LA_X)/3 \quad \text{[Equation 9]}$$

In this specification, the uniformity of the large surface area substrate density, that is, the ULAD is expressed as Equation 10 below.

$$ULAD=[(LAD_{max}-LAD_{min})/LAD_{ave}]\times 100[\%] \quad \text{[Equation 10]}$$

Herein, the $LAD_{max}$ refers to a maximum value of the large surface area substrate densities in the wafer loading region 600. The $LAD_{min}$ refers to a minimum value of the large surface area substrate densities in the wafer loading region 600. The $LAD_{ave}$ refers an average of the large surface area substrate densities in the wafer loading region 600.

According to the embodiment, in case the maximum number of loadable substrates is X (X is a natural number equal to or greater than 3), i.e., the number of slots is equal to X, dispersed loading is performed as follows. Y (Y is a natural number less than X) large surface area substrates including patterns formed on surfaces thereof is loaded, wherein each of the large surface area substrates is a substrate whose surface area is larger than or equal to $3\pi r^2$ where r is a radius thereof, in the substrate retainer in a dispersed manner by adjusting Z (Z is a natural number) indicating a maximum number of large surface area substrates loaded consecutively in the substrate retainer to be less than Y such that a ULAD (uniformity of large surface area substrate density) when Z is adjusted is less than a ULAD when Z is equal to Y, wherein each ULAD is calculated based on: (i) a LAD (large surface area substrate density) of every 11 large surface area substrates loaded in a total of 11 slots consisting of a given slot and 10 slots closest thereto when X is equal to or greater than 25 and equal to or less than 200, (ii) a LAD of every 5 large surface area substrates loaded in a total of 5 slots consisting of a given slot and 4 slots closest thereto when X is equal to or greater than 11 and equal to or less than 24, and (iii) a LAD of every 3 large surface area substrates loaded in a total of 3 slots consisting of a given slot and 2 slots closest thereto when X is equal to or greater than 5 and equal to or less than 10.

Hereinafter, specific examples of the embodiment will be described. First, an example of improving the thickness uniformity between the films formed on the large surface area wafers 601 accommodated in the wafer loading region 600 by loading the large surface area wafers 601 dispersedly (in a dispersed manner) will be described. FIG. 4 schematically illustrates a first substrate loading pattern that no large surface area wafer 601 is loaded in the wafer loading region 600 of the batch processing apparatus. The wafer loading region 600 is, for example, capable of accommodating a total of 100 wafers. In other words, 100 slots are provided in the wafer loading region 600 of the batch processing apparatus. FIG. 5 schematically illustrates a second substrate loading pattern that a total of 24 large surface area wafers 601 are loaded in the wafer loading region 600 of the batch processing apparatus capable of accommodating 100 wafers. According to the second substrate loading pattern, the total of 24 large surface area wafers 601 are loaded collectively at the upper portion of the wafer loading region 600 of the boat 217. That is, the total of 24 large surface area wafers 601 are loaded in a series of slots provided consecutively at the upper portion of wafer loading region 600. Conventionally, the wafers are loaded using the second loading pattern. FIG. 6 schematically illustrates a third substrate loading pattern that a total of 24 large surface area wafers 601 are loaded dispersedly (in a dispersed manner) in the wafer loading region 600 of the batch processing apparatus capable of accommodating 100 wafers. Referring to FIG. 6, the total of 24 large surface area wafers 601 are loaded dispersedly in the wafer loading region 600 such that the uniformity of the large surface area substrate density (the ULAD) of the wafer loading region 600 according to the third substrate loading pattern is less than the ULAD of the wafer loading region 600 according to the second substrate loading pattern shown in FIG. 5.

Figure 4:
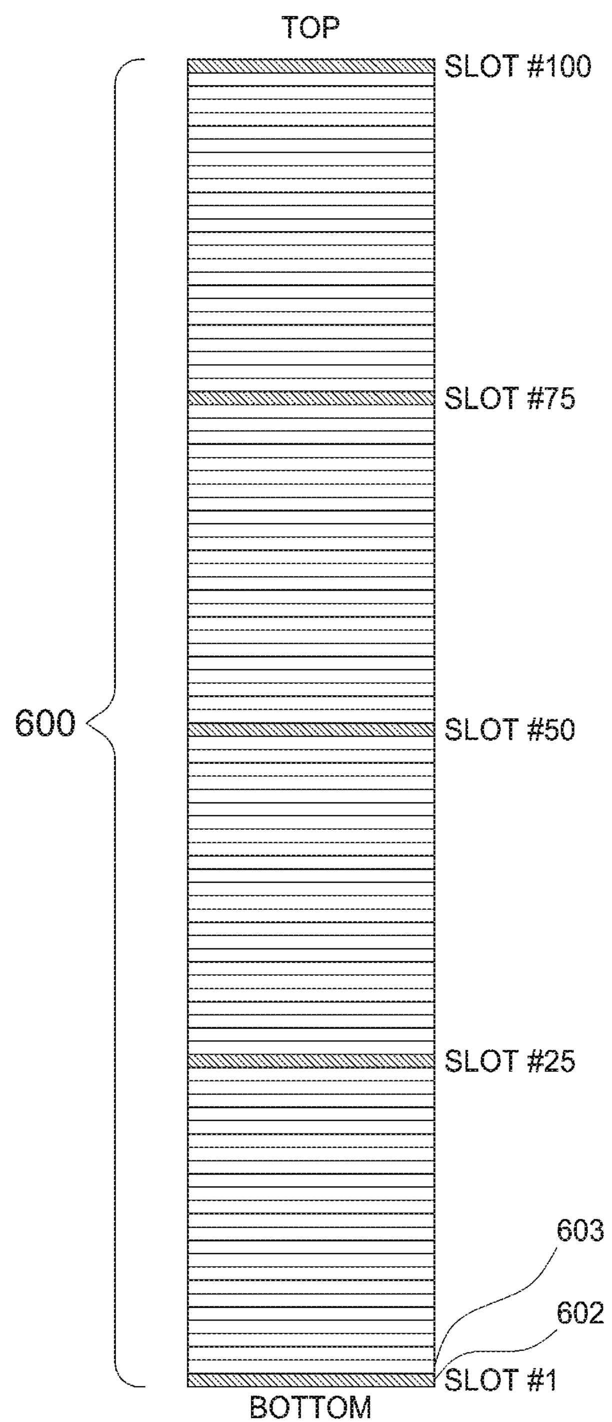
FIG. 4 schematically illustrates a first substrate loading pattern according to the embodiment.
Figure 5:
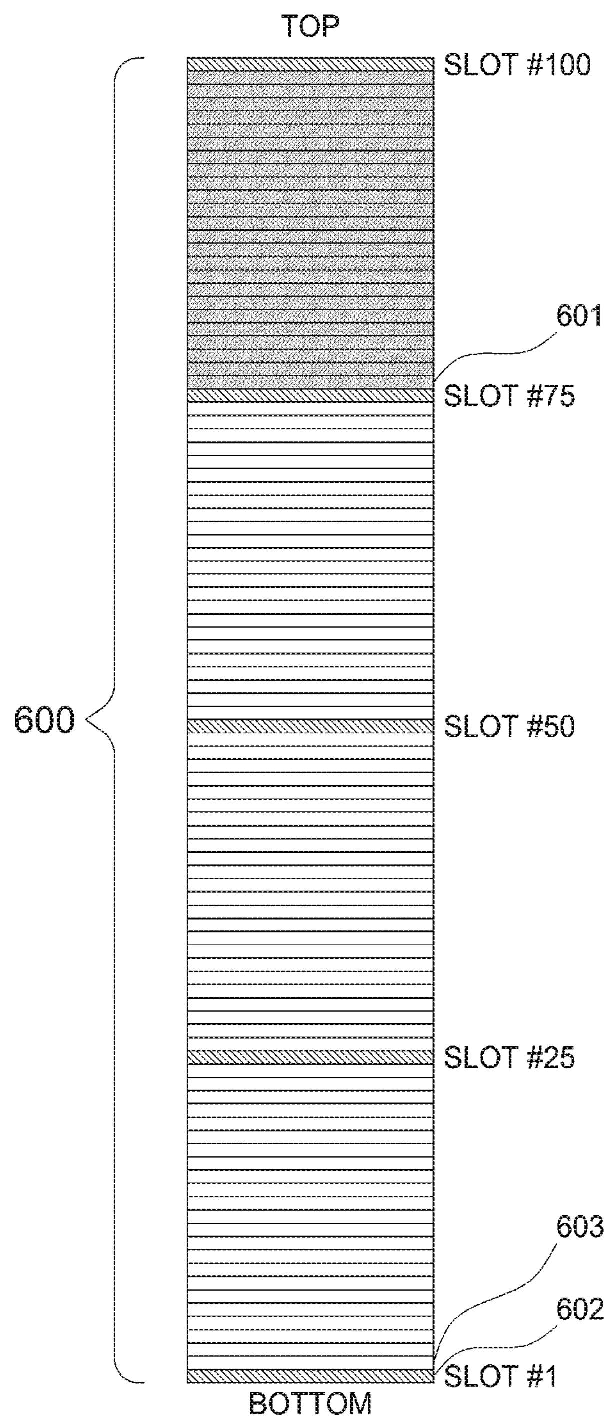
FIG. 5 schematically illustrates a second substrate loading pattern according to the embodiment.
Figure 6:
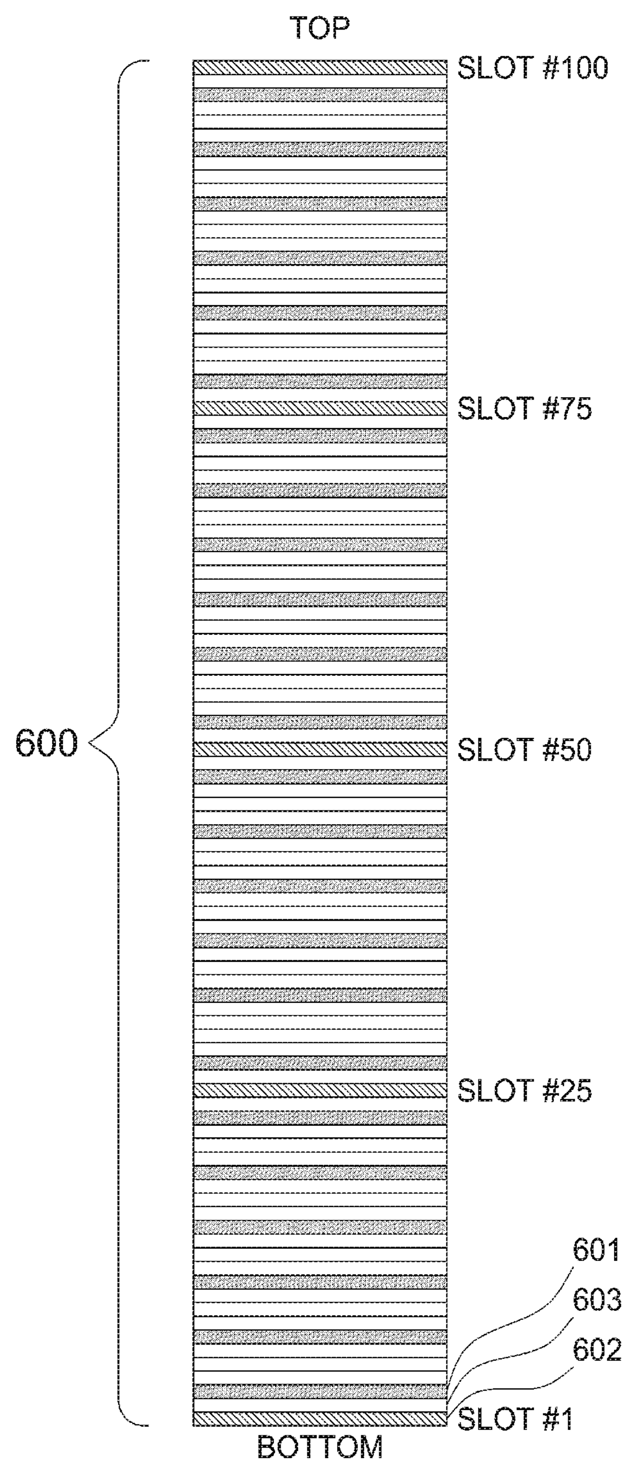
FIG. 6 schematically illustrates a third substrate loading pattern according to the embodiment.
Figure 7:
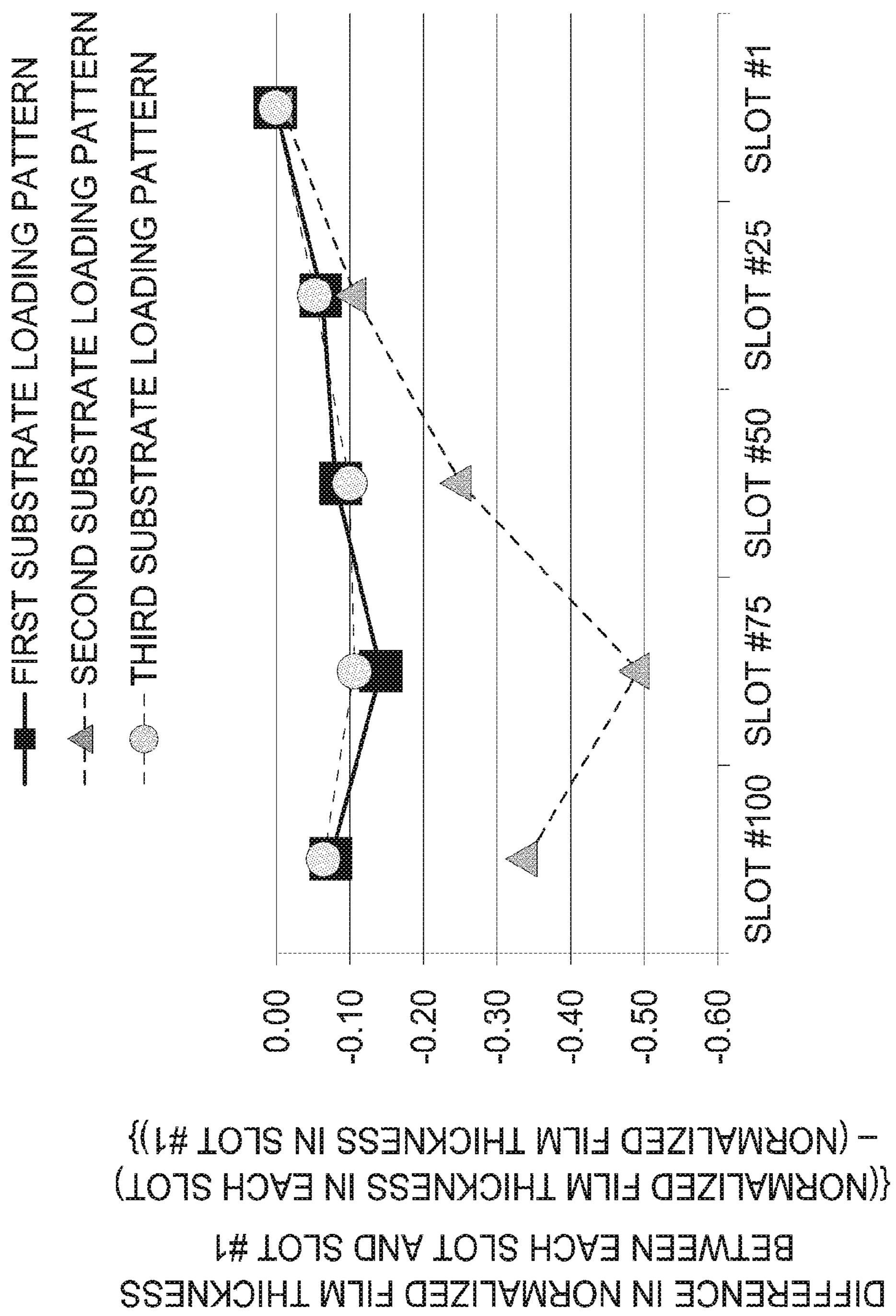
FIG. 7 is a graph showing thickness distributions of films formed on substrates loaded in a substrate loading region of the embodiment according to the first substrate loading pattern, the second substrate loading pattern and the third substrate loading pattern, respectively (differences between normalized film thicknesses of the substrates in the substrate loading region and a normalized film thickness of a substrate loaded at the bottom of the substrate loading region, respectively).
Figure 8:
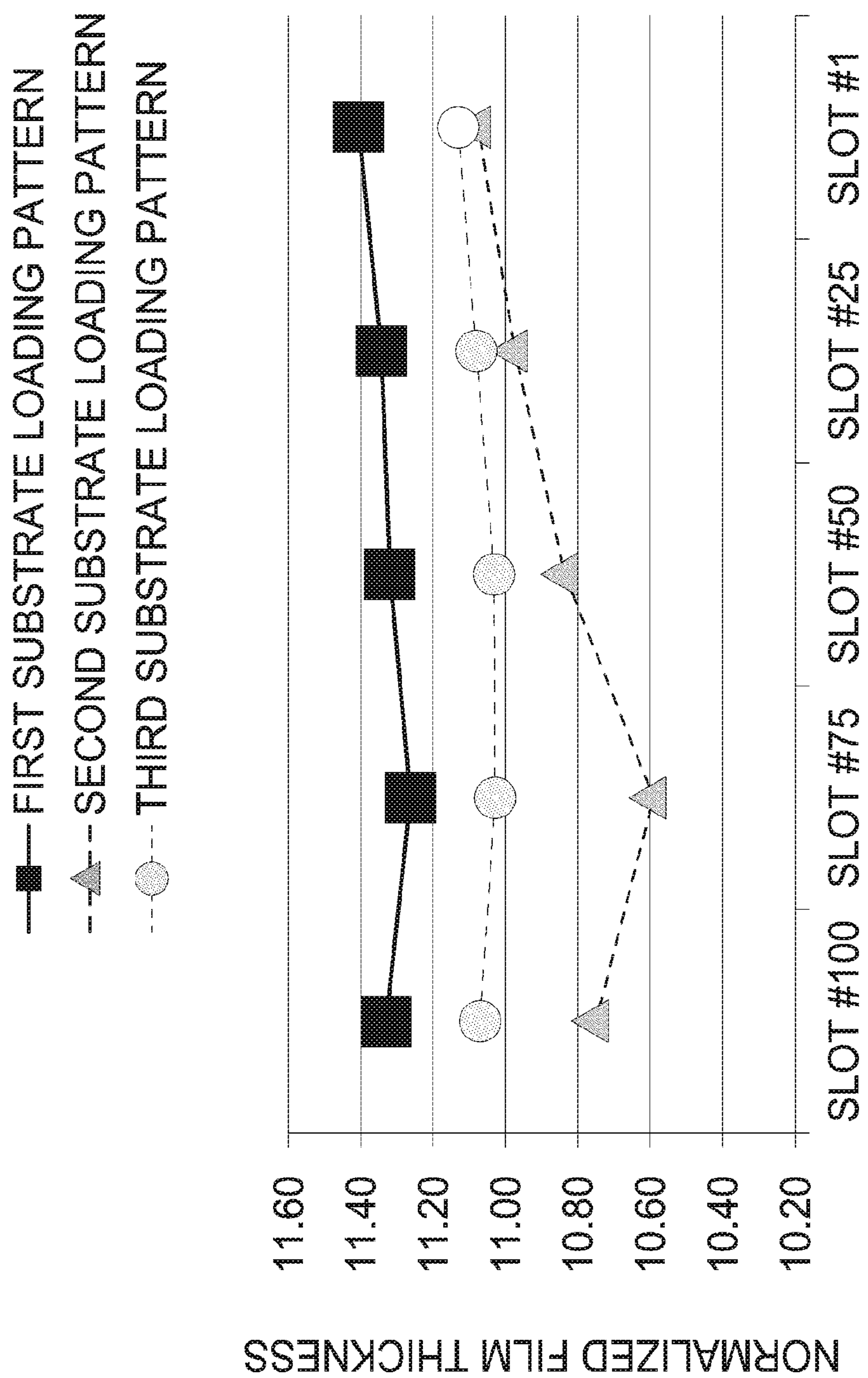
FIG. 8 is a graph showing thickness distributions of films formed on the substrates loaded in the substrate loading region of the embodiment according to the first substrate loading pattern, the second substrate loading pattern and the third substrate loading pattern, respectively (the normalized film thicknesses of the substrates in the substrate loading region, respectively).

The monitor wafers 602 are inserted into the slot #1, the slot #25, the slot #50, the slot #75 and the slot #100 according to each of the first substrate loading pattern shown in FIG. 4, the second substrate loading pattern shown in FIG. 5 and the third substrate loading pattern shown in FIG. 6, in order to monitor the thickness distribution of the films in the wafer loading region 600 (i.e., the thickness uniformity between the films formed on the wafers in the wafer loading region 600). The films are formed, for example, according to the film-forming process (substrate processing) described later after the wafers 200 are loaded according to the first substrate loading pattern shown in FIG. 4, the second substrate loading pattern shown in FIG. 5 and the third substrate loading pattern shown in FIG. 6, respectively. In FIGS. 7 and 8, film-forming results for each case are shown for comparison. Comparing the film-forming result when the wafers 200 are loaded according to the first substrate loading pattern shown in FIG. 4 (i.e., no large surface area wafer 601 is loaded in the wafer loading region 600) and the film-forming result when the wafers 200 are loaded according to the second substrate loading pattern shown in FIG. 5 (i.e., the total of 24 large surface area wafers 601 are loaded collectively at the upper portion of the boat 217), a thickness of a film formed on the monitor wafer 602 loaded in the slot #75 is significantly thinner than thicknesses of the films formed on the other monitor wafers 602 loaded in the other slots in case that the films are formed when the wafers 200 are loaded according to the second substrate loading pattern, that is, the total of 24 large surface area wafers 601 are loaded collectively in the vicinity of the slot #75. That is, the loading effect between the substrates greatly affects the film-forming when the wafers 200 are loaded according to the second substrate loading pattern. However, when the films are formed after the wafers 200 are loaded according to the third substrate loading pattern, that is, the total of 24 large surface area wafers 601 are loaded dispersedly, a local film thickness reduction due to the large surface area wafers 601 is not observed in the wafer loading region 600. Thus, the thickness uniformity between the films in the wafer loading region 600 is properly maintained.

Depending on the number of the large surface area wafers 601 to be loaded, there may be some cases where some of the large surface area wafers 601 are loaded in some slots that are less dispersed from other large surface area wafers 601 because it is difficult to load all of the large surface area wafers 601 in a perfectly dispersed manner. However, in the embodiment, it is not necessary to load all of the large surface area wafers 601 in a perfectly dispersed manner. For the purpose of obtaining the advantageous effects of the embodiment such as suppressing the loading effect, it is sufficient to load the large surface area wafers 601 in a comparatively dispersed manner such that the ULAD in that case is less than the ULAD in case the large surface area wafers 601 are loaded not dispersedly (i.e., loaded collectively).

Figure 9:
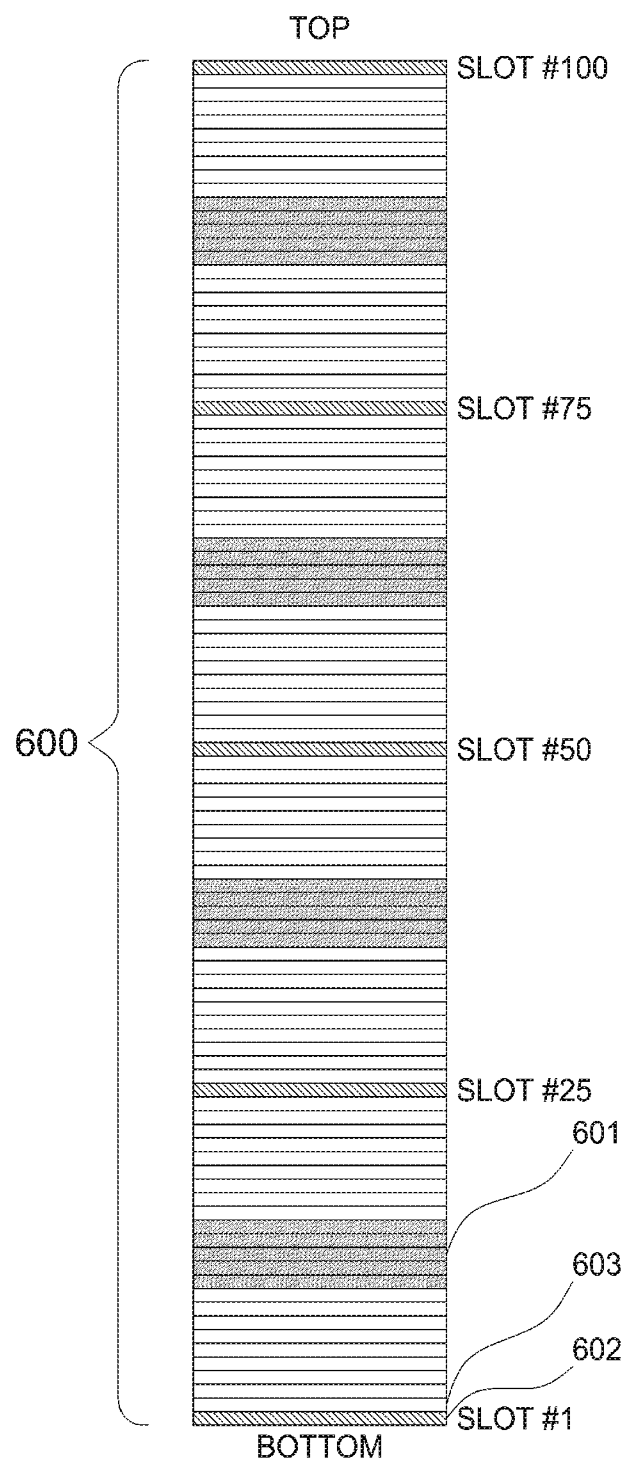
FIG. 9 schematically illustrates a fourth substrate loading pattern according to the embodiment.
Figure 10:
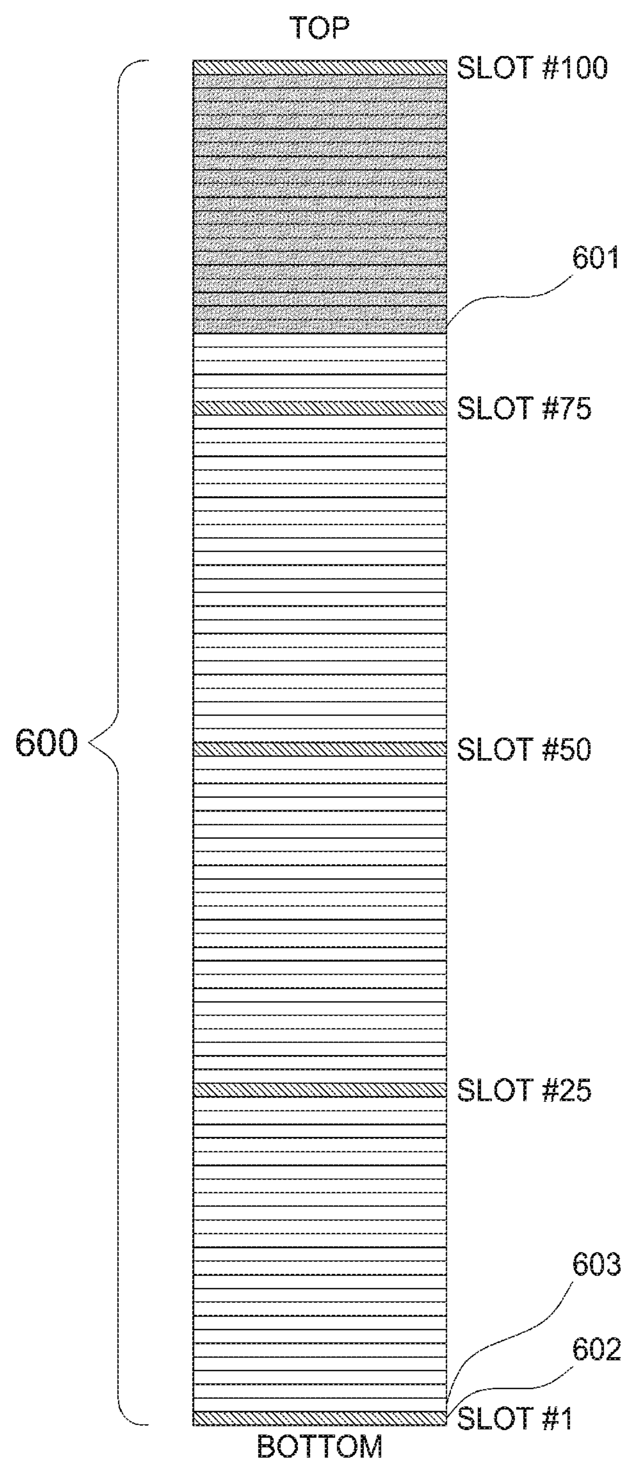
FIG. 10 schematically illustrates a fifth substrate loading pattern according to the embodiment.
Figure 11:
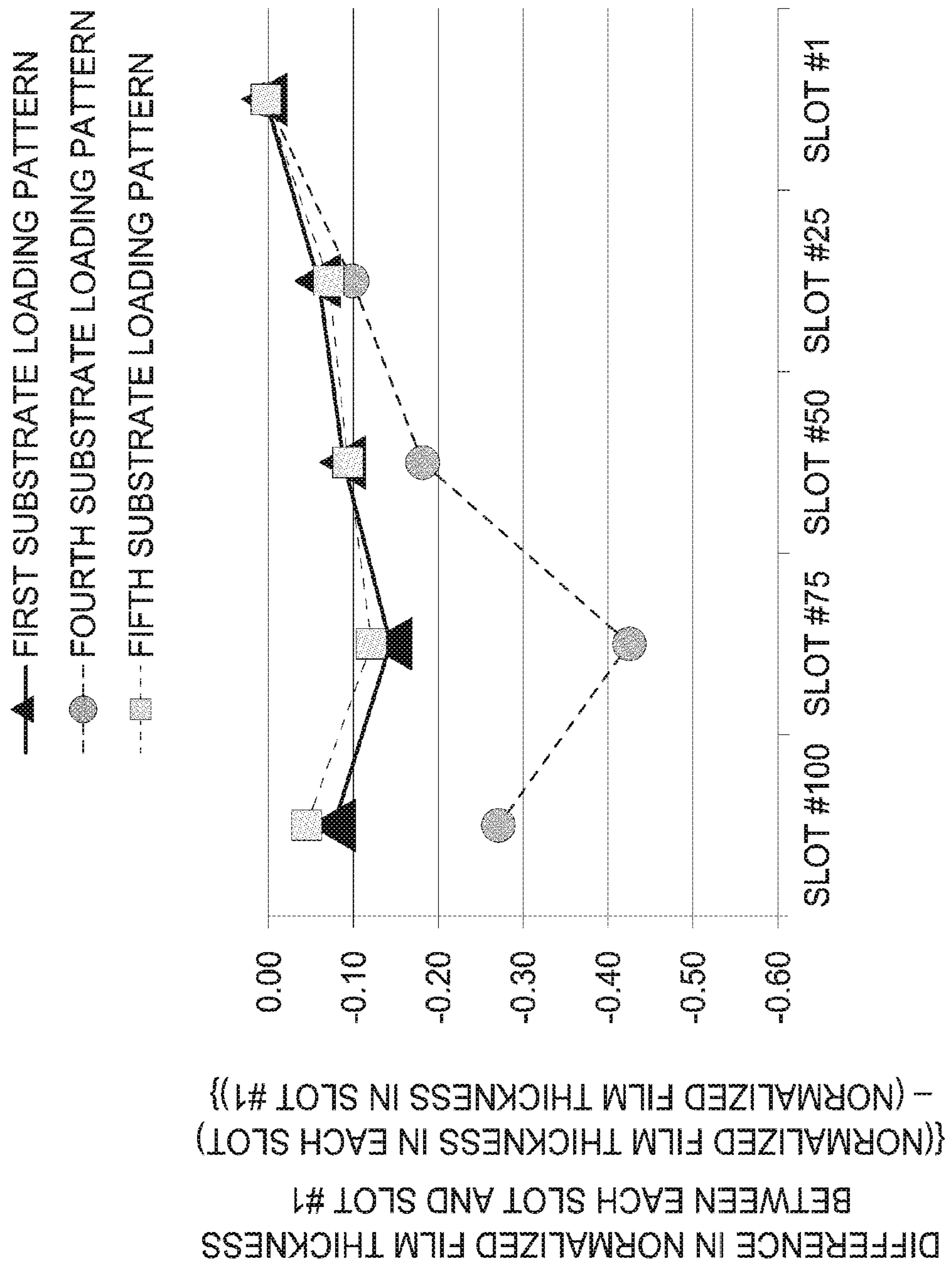
FIG. 11 is a graph showing thickness distributions of films formed on substrates loaded in the substrate loading region of the embodiment according to the first substrate loading pattern, the fourth substrate loading pattern and the fifth substrate loading pattern, respectively (differences between normalized film thicknesses of the substrates in the substrate loading region and a normalized film thickness of a substrate loaded at the bottom of the substrate loading region, respectively).
Figure 12:
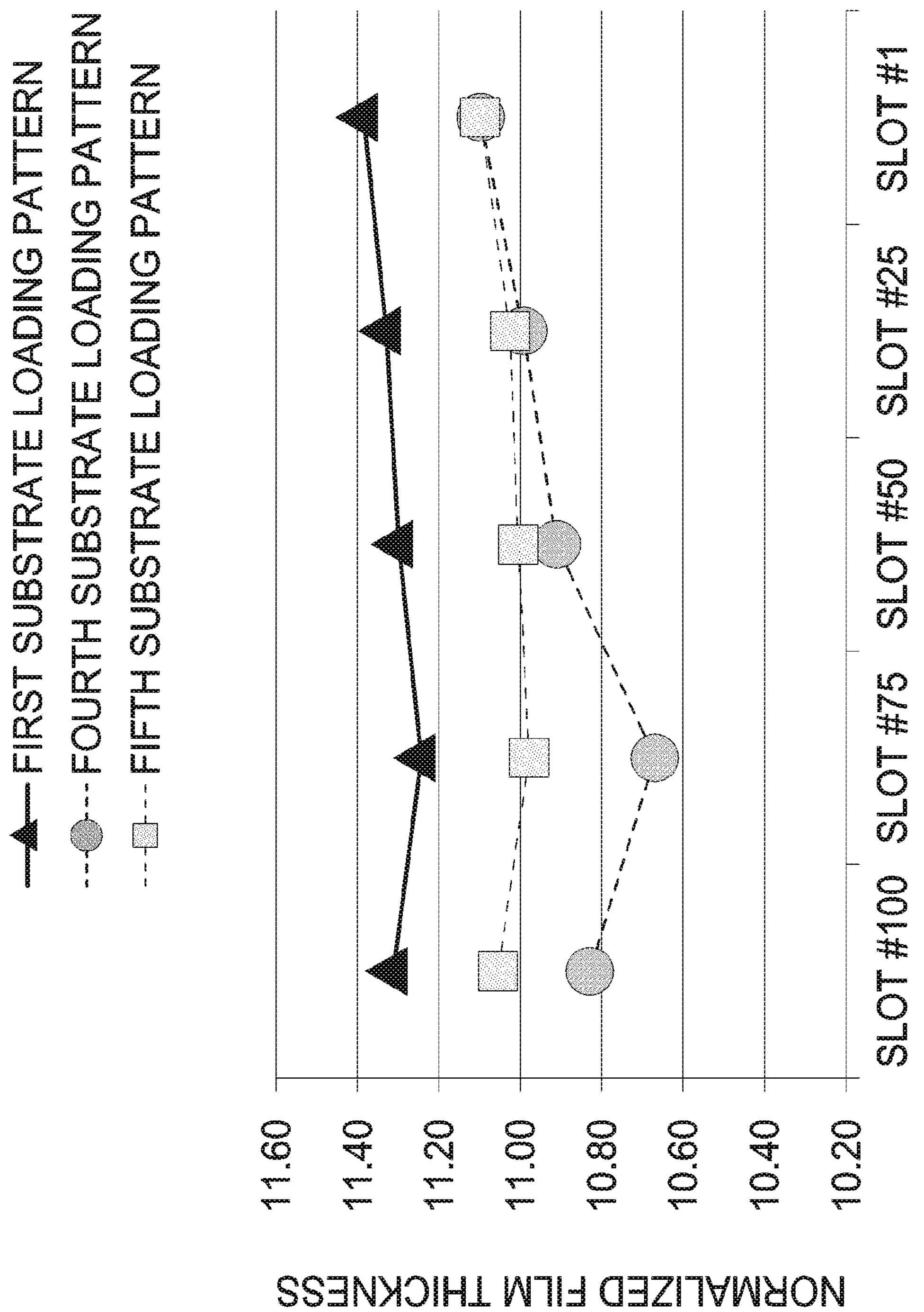
FIG. 12 is a graph showing thickness distributions of the films formed on the substrates loaded in the substrate loading region of the embodiment according to the first substrate loading pattern, the fourth substrate loading pattern and the fifth substrate loading pattern, respectively (the normalized film thicknesses of the substrates in the substrate loading region, respectively).

FIG. 9 schematically illustrates a fourth substrate loading pattern according to the embodiment. The fourth substrate loading pattern is applied to a case where a substrate transfer mechanism (not shown) having a function of suitably selecting an operation mode between a single substrate transfer mode (i.e., a mode for transferring a substrate individually at a time) and a 5-substrates batch transfer mode (i.e., a mode for transferring a total of 5 substrates at a time) is used to transfer the wafers 200. For shortening the time for transferring a total of 19 large surface area wafers 601, the 5-substrates batch transfer mode is used as many times as possible, and the remaining wafers less than 5 is transferred using the single substrate transfer mode. The total of 19 large surface area wafers 601 are loaded dispersedly in the wafer loading region 600 according to the fourth substrate loading pattern using the above-described substrate transfer mechanism such that the density distribution of the large surface area substrate is flattened compared with the density distribution of the large surface area substrate when the 19 large surface area wafers 601 are loaded not dispersedly (i.e., loaded collectively). According to the fourth substrate loading pattern, each subgroup of the large surface area wafers 601 is loaded near the center portion of two monitor wafers 602 closest thereto. Further, FIG. 10 schematically illustrates a fifth substrate loading pattern where all of the 19 large surface area wafers 601 are loaded collectively at the upper end portion of the wafer loading region 600 of the boat 217. That is, all of the 19 large surface area wafers 601 are loaded in a series of slots provided consecutively at the upper end portion of the wafer loading region 600. In FIGS. 11 and 12, film-forming results for each case are shown for comparison.

Referring to FIG. 9, the total of 19 large surface area wafers 601 are loaded dispersedly in the wafer loading region 600 such that 5 of them are loaded between the slots #75 and #100, 5 of them between the slots #50 and #75, 5 of them between the slots #25 and #50 and the remaining 4 of them between the slots #0 and #25 according to the fourth substrate loading pattern. Comparing the film-forming results between the fourth substrate loading pattern shown in FIG. 9 and the fifth substrate loading pattern shown in FIG. 10, a local film thickness reduction is not observed and a favorable thickness uniformity between the films in the wafer loading region 600 is achieved according to the fourth substrate loading pattern.

Figure 13:
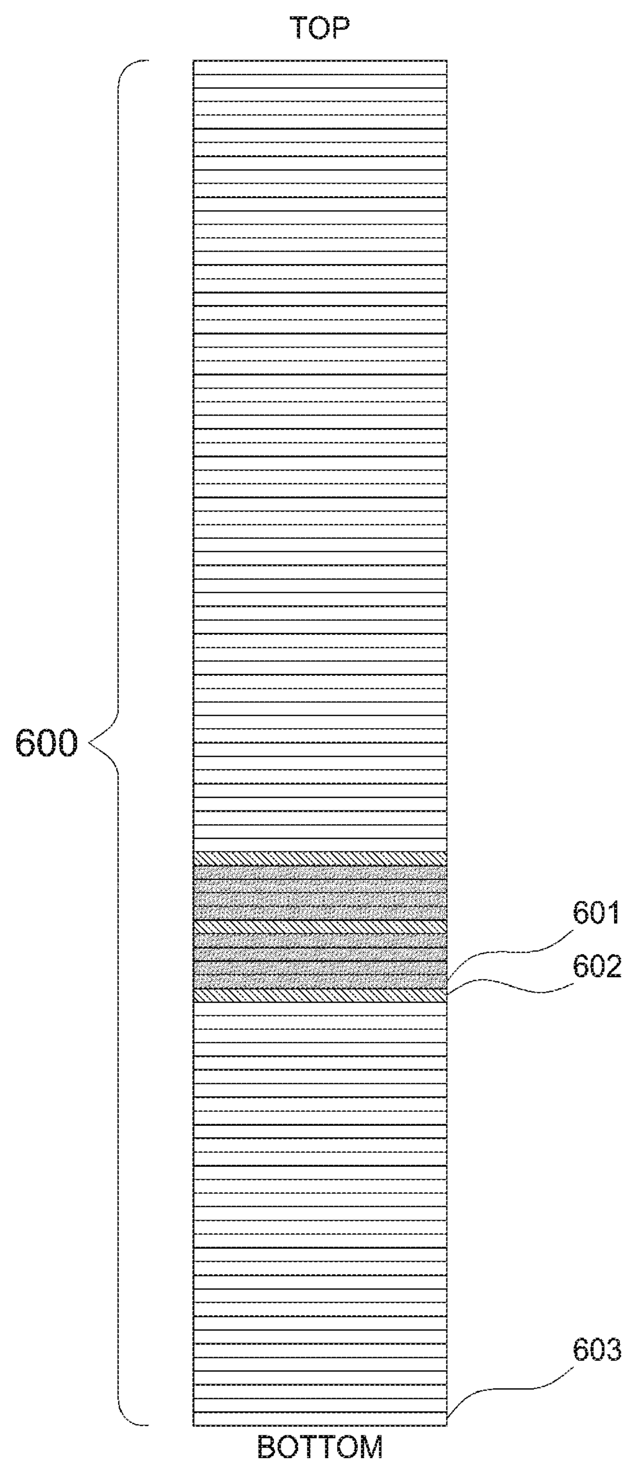
FIG. 13 schematically illustrates a sixth substrate loading pattern according to the embodiment.
Figure 14:
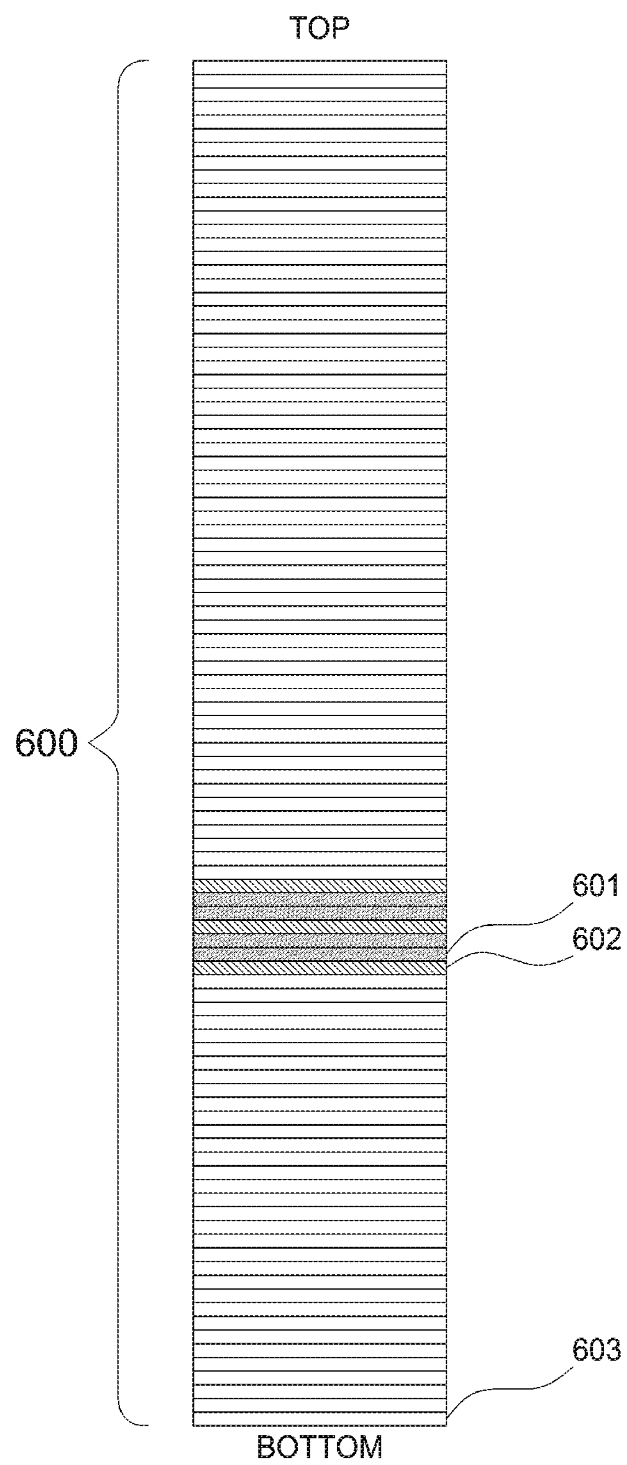
FIG. 14 schematically illustrates a seventh substrate loading pattern according to the embodiment.
Figure 15:
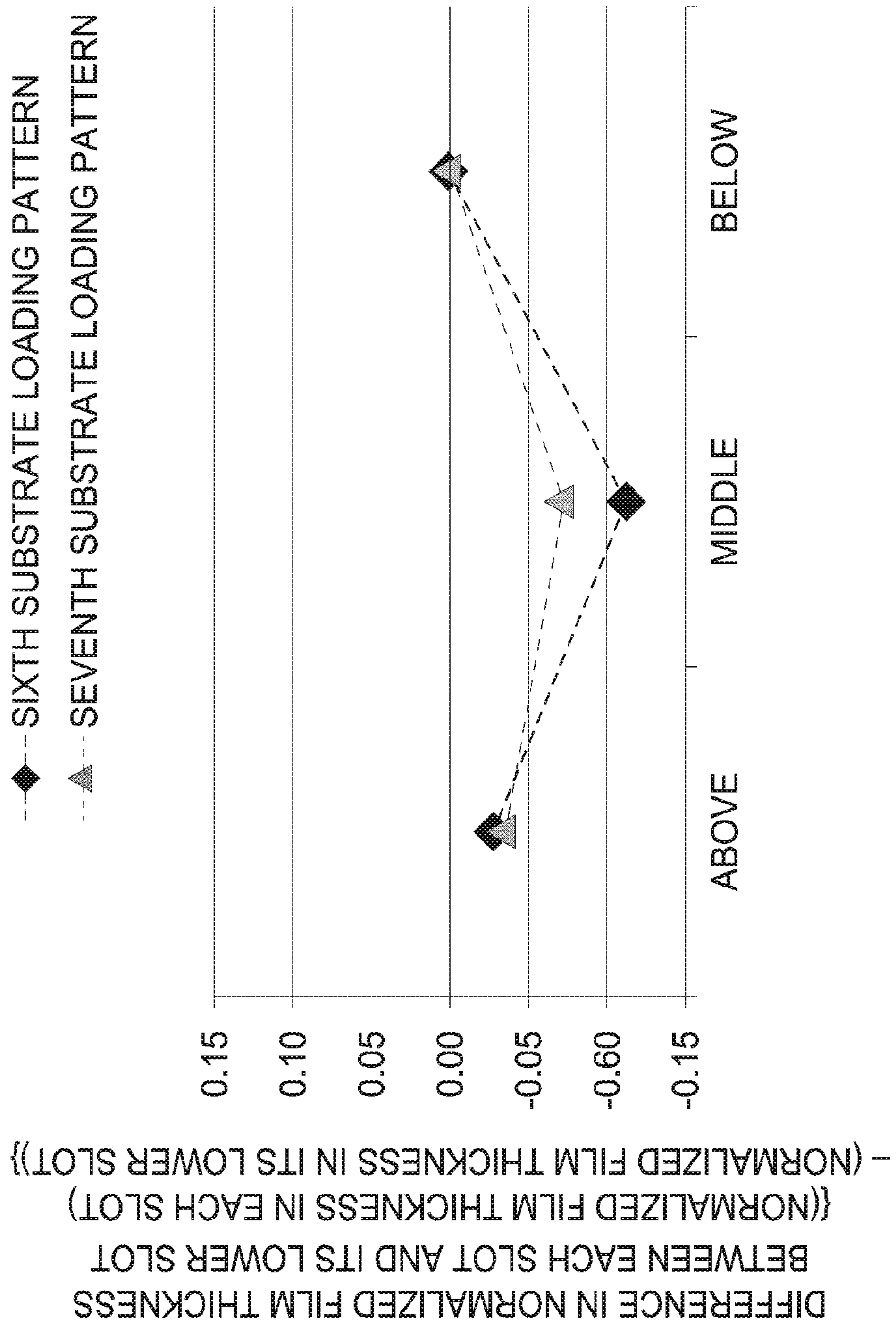
FIG. 15 is a graph showing thickness distributions of films formed on substrates loaded in a substrate loading region of the embodiment according to the sixth substrate loading pattern and the seventh substrate loading pattern, respectively (differences between normalized film thicknesses of the substrates in the substrate loading region and a normalized film thickness of a substrate loaded immediately below a region where a large surface area wafers are loaded, respectively).
Figure 16:
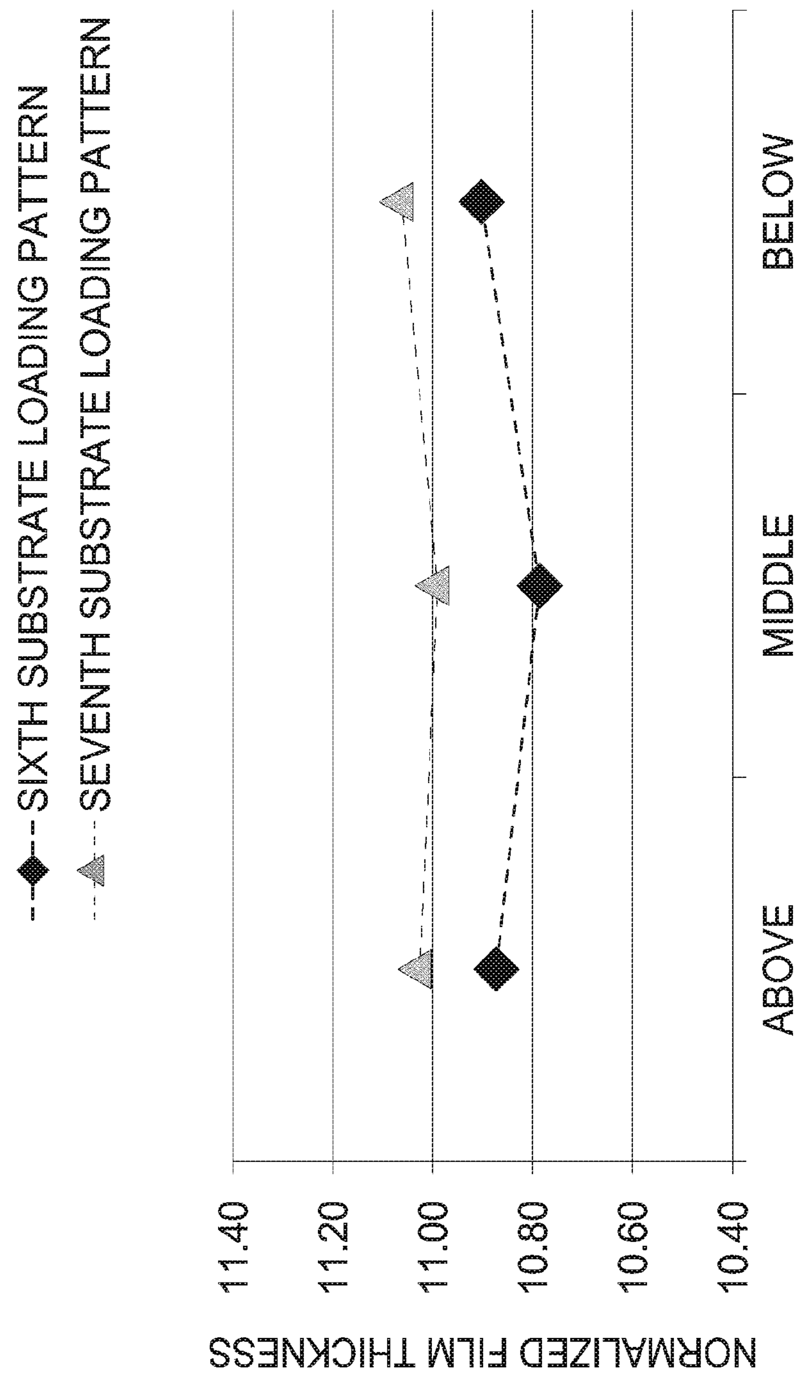
FIG. 16 is a graph showing thickness distributions of the films formed on the substrates loaded in the substrate loading region of the embodiment according to the sixth substrate loading pattern and the seventh substrate loading pattern, respectively (the normalized film thicknesses of the substrates in the substrate loading region, respectively).

Next, a result of examining an influence on the thickness distribution of the films by changing the number of the large surface area wafers 601 included in each subgroup of the large surface area wafers 601 will be described. The monitor wafers 602 are inserted between the large surface area wafers 601, and the relationship between the number of the large surface area wafers 601 included in each subgroup of the large surface area wafers 601 and the thickness distribution of the films between the subgroups of the large surface area wafers 601 is examined. FIG. 13 schematically illustrates a sixth substrate loading pattern according to the embodiment, where a total of 8 large surface area wafers 601 are loaded in the wafer loading region 600 of the batch processing apparatus capable of accommodating 100 wafers (i.e., 100 slots are provided in the wafer loading region 600 of the batch processing apparatus). According to the sixth substrate loading pattern, three monitor wafers 602 are respectively loaded immediately above, immediately below and in the middle of a region where the 8 large surface area wafers 601 are loaded. FIG. 14 schematically illustrates a seventh substrate loading pattern according to the embodiment, where a total of 4 large surface area wafers 601 are loaded in the wafer loading region 600 of the batch processing apparatus described above. According to the seventh substrate loading pattern, the monitor wafers 602 are loaded immediately above, immediately below and in the middle of a region where the 4 large surface area wafers 601 are loaded. In FIGS. 15 and 16, film-forming results for each case are shown for comparison.

Comparing, with reference to FIG. 15, the results between the sixth substrate loading pattern where each subgroup consists of 8 large surface area substrates 601 and the seventh substrate loading pattern where each subgroup consists of 4 large surface area substrates 601, the differences between the film thickness of the monitor wafer 602 loaded in the center portion and the film thicknesses of the monitor wafers 602 loaded immediately above and immediately below the large surface area wafers 601 are reduced according to the seventh substrate loading pattern. That is, the reduction of the film thickness at the center portion of a region where the subgroup of the large surface area wafers 601 are loaded can be suppressed as compared with the film thicknesses at the end portions of the region where the subgroup of the large surface area wafers 601 are loaded when the large surface area wafers 601 are loaded according to the seventh substrate loading pattern. In order to improve the thickness uniformity between the films in the subgroups of the large surface area wafers 601 in case of dispersed loading, it is preferable to reduce the number of the large surface area wafers 601 included in each subgroup and increase the number of the subgroups as long as the number of the wafers 200 does not exceed the number of the slots in the wafer loading region 600.

As described above, there is a trade-off between the shortening of the transfer time and the improvement of the ULAD. When the shortening of the transfer time is prioritized, the large surface area wafers 601 may be arranged for that purpose while sacrificing the film thickness uniformity between the subgroup of the large surface area wafers 601 and the ULAD of the wafer loading region 600. The trade-off between the uniformity and the shortening of the transfer time can be appropriately adjusted depending on which is prioritized. The advantageous effects of the embodiment can be obtained by loading the large surface area wafers 601 dispersedly such that the ULAD becomes smaller than the case where the large surface area wafers 601 are loaded not dispersedly.

Figure 17:
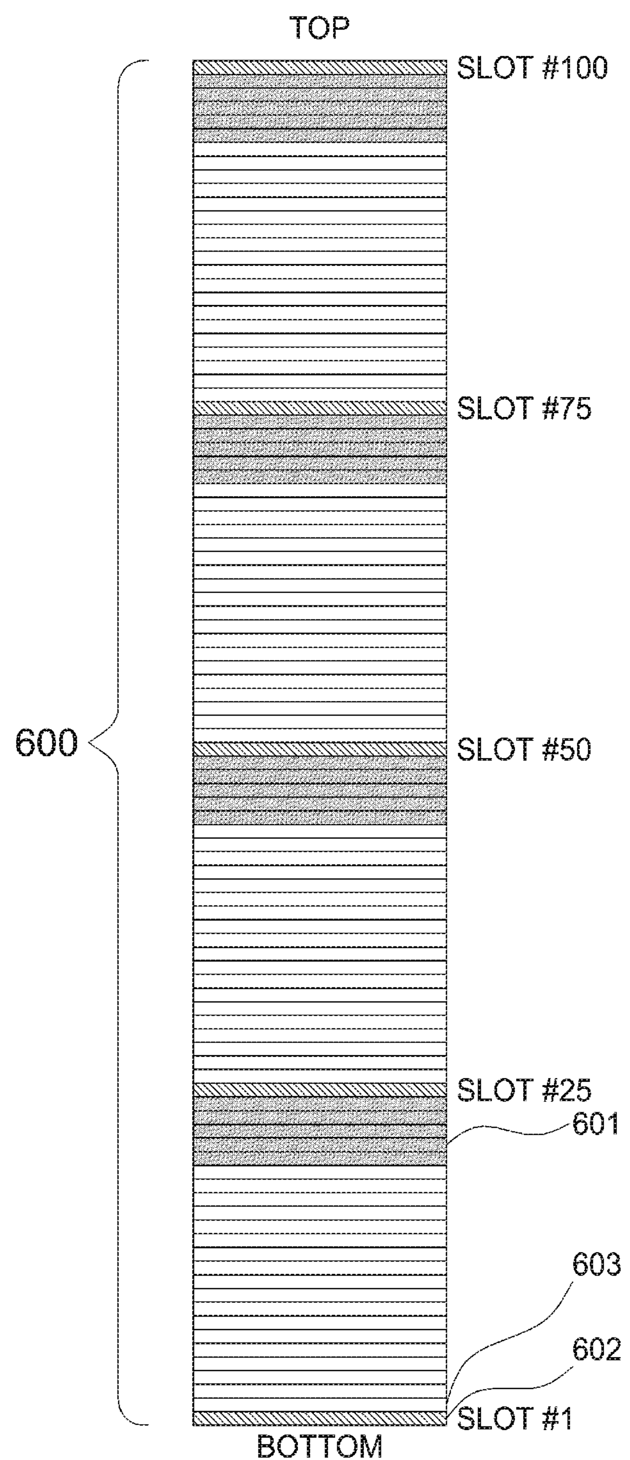
FIG. 17 schematically illustrates an eighth substrate loading pattern according to the embodiment that large surface area substrates are loaded dispersedly immediately below each of monitor substrates.
Figure 18:
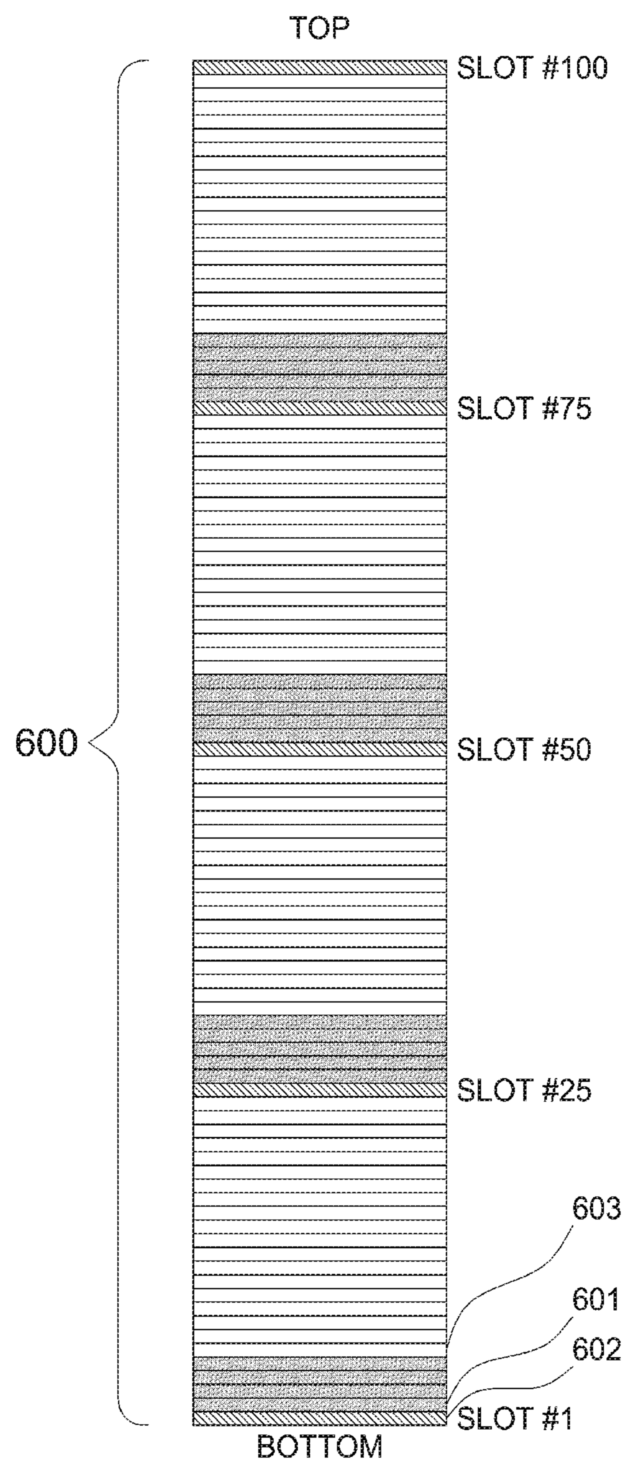
FIG. 18 schematically illustrates a ninth substrate loading pattern according to the embodiment that the large surface area substrates are loaded dispersedly immediately above each of the monitor substrates.
Figure 19:
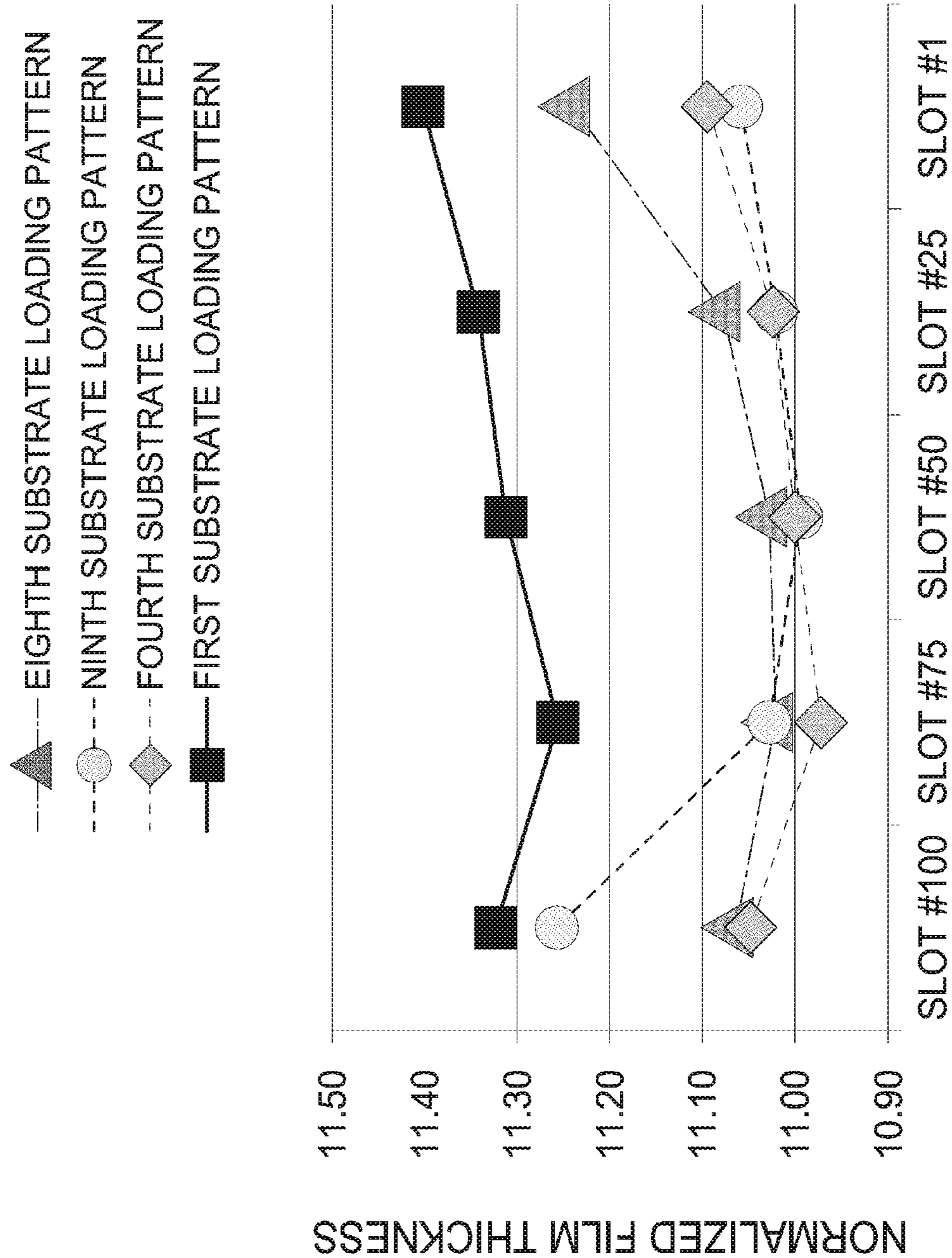
FIG. 19 is a graph showing thickness distributions of the films formed on substrates loaded in the substrate loading region of the embodiment according to the first substrate loading pattern, the fourth substrate loading pattern, the eighth substrate loading pattern and the ninth substrate loading pattern, respectively (the normalized film thicknesses of the substrates in the substrate loading region, respectively).

Next, an influence of distances between each monitor wafer 602 and the large surface area wafers 601 will be described. FIG. 17 schematically illustrates an eighth substrate loading pattern that each subgroup of the large surface area wafers 601 is loaded in a slot immediately below each of monitor wafers 602. FIG. 18 schematically illustrates a ninth substrate loading pattern that each subgroup of the large surface area wafers 601 is loaded in a slot immediately above each of monitor wafers 602. In FIG. 19, film-forming results for each case shown in FIGS. 17 and 18 are shown for comparison, with the film-forming result according to the first substrate loading pattern shown in FIG. 4 (where no large surface area wafer 601 is loaded in the wafer loading region 600) and the film-forming result according to the fourth substrate loading pattern shown in FIG. 9 (where each subgroup of the large surface area wafers 601 is loaded near the center of the two closest monitor wafers 602).

When each subgroup of the large surface area wafers 601 is loaded immediately below the monitor wafer 602 closest thereto as in the eighth substrate loading pattern, the distance between the monitor wafer 602 of the slot #1 and the large surface area wafer 601 closest thereto is longer than the distance between each of the monitor wafers 602 of the slots #100, #75, #50 and #25 and the large surface area wafer 601 closest thereto. Therefore, for the monitor wafer 602 of the slot #1, a rate of reducing the film thickness due to the presence of the large surface area wafers 601 can be lowered. That is, the amount of reduction in the film thickness on the monitor wafer 602 of the slot #1 is smaller than those of the other slots #100, #75, #50 and #25. As a result, the film formed on the monitor wafer 602 of slot #1 becomes thicker than the films formed on the monitor wafers 602 of the other slots. Therefore, the difference between the film thickness of the monitor wafer 602 of slot #1 according to the eighth substrate loading pattern and the film thickness of the monitor wafer 602 of slot #1 when no large surface area wafer 601 is loaded in the wafer loading region 600 becomes smaller than the difference between the film thickness of each of the monitor wafers 602 of the other slots according to the eighth substrate loading pattern and the film thicknesses of each of the monitor wafers 602 of the other slots when no large surface area wafer 601 is loaded in the wafer loading region 600.

Further, when each subgroup of the large surface area wafers 601 is loaded immediately above the monitor wafer 602 closest thereto as in the ninth substrate loading pattern, the distance between the monitor wafer 602 of the slot #100 and the large surface area wafer 601 closest thereto is longer than the distance between each of the monitor wafers 602 of the slots #75, #50, #25 and #1 and the large surface area wafer 601 closest thereto. Therefore, for the monitor wafer 602 of the slot #100, a rate of reducing the film thickness due to the presence of the large surface area wafers 601 can be lowered. That is, the amount of reduction in the film thickness on the monitor wafer 602 of the slot #100 is smaller than those of the other slots #75, #50, #25 and #1. As a result, the film formed on the monitor wafer 602 of slot #100 becomes thicker than the films formed on the monitor wafers 602 of the other slots. Therefore, the difference between the film thickness of the monitor wafer 602 of slot #100 according to the ninth substrate loading pattern and the film thickness of the monitor wafer 602 of slot #100 when no large surface area wafer 601 is loaded in the wafer loading region 600 becomes smaller than the difference between the film thickness of each of the monitor wafers 602 of the other slots according to the ninth substrate loading pattern and the film thicknesses of each of the monitor wafers 602 of the other slots when no large surface area wafer 601 is loaded in the wafer loading region 600.

However, when calculating the uniformity of film thickness of the wafer loading region 600 from the film thicknesses of the monitor wafers 602, variations in the numerical value of the uniformity will occur when the distance between each monitor wafer 602 and the large surface area wafer 601 closest thereto is not unified (not constant). Thus, the assessment and management of the thickness uniformity between the films may become difficult.

When each subgroup of the large surface area wafers 601 are loaded in the central regions between the two monitor wafers 602 closest thereto as in the fourth substrate loading pattern and the distance between the monitor wafer 602 in each slot and the large surface area wafer 601 closest thereto is substantially equalized (i.e., vary minimally), the amount of reduction in the film thickness of the monitor wafer 602 in each slot becomes equal or nearly equal. As a result, the difference between the film thickness of the monitor wafer 602 according to the fourth substrate loading pattern and the film thickness of the monitor wafer 602 when no large surface area wafer 601 is loaded according to the first substrate loading pattern becomes equal or nearly equal in each slot, and the thickness distribution of the films formed on the wafers 200 according to the fourth substrate loading pattern becomes similar to that of the wafers 200 when no large surface area wafer 601 is loaded according to the first substrate loading pattern. Thus, the assessment and management of the uniformity of the film thickness can become easier. Therefore, when inserting (loading) a plurality of monitor wafers 602 into the wafer loading region 600, it is preferable that the distance between each monitor wafer 602 and the large surface area wafers 601 remains constant by loading the subgroups of the large surface area wafers 601 in the central regions between the two closest monitor wafers 602.

Figure 20:
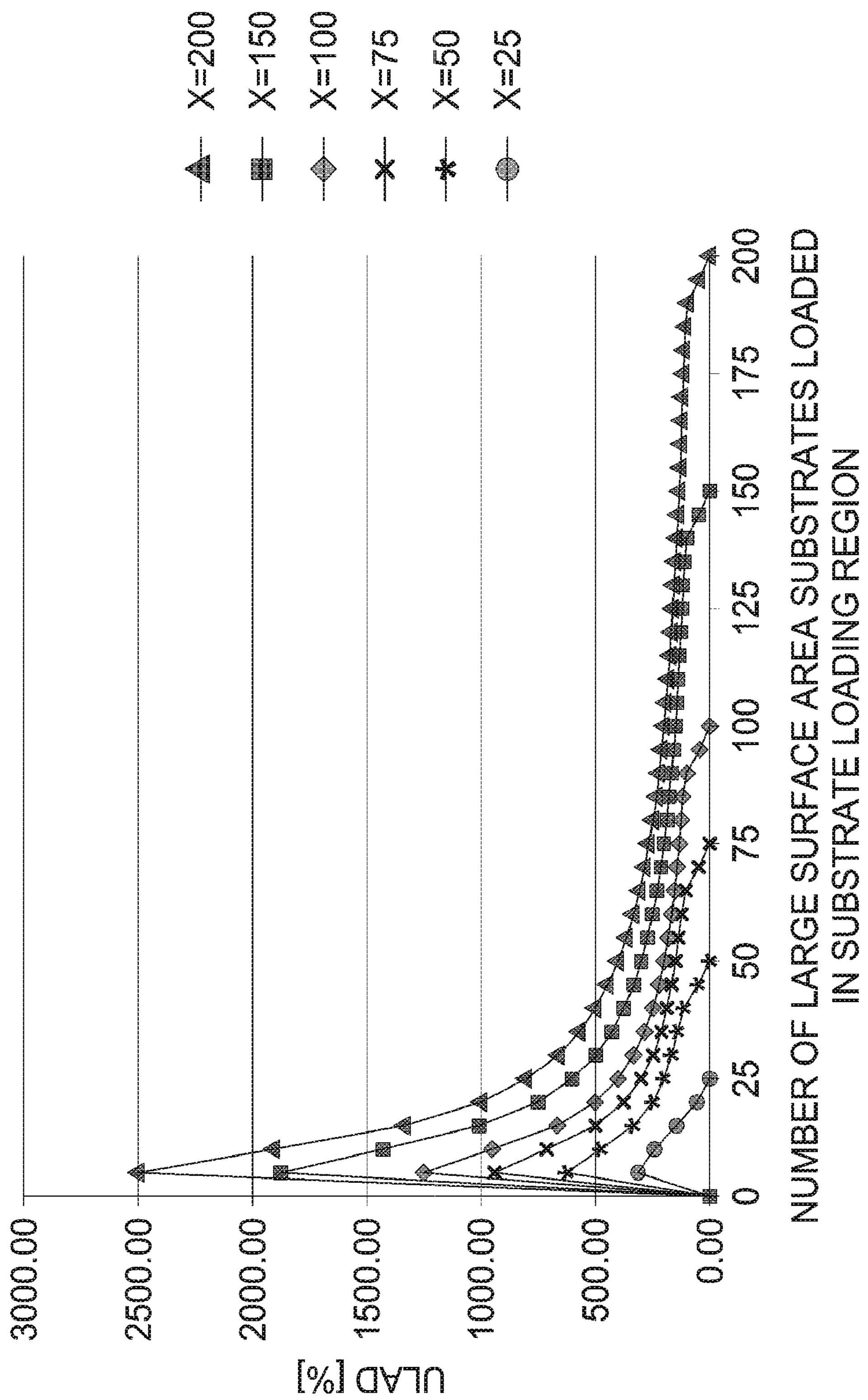
FIG. 20 is a graph showing relationships between ULAD and the number of the large surface area substrates when the substrates are loaded collectively (i.e., in a concentrated manner) at an upper end of the substrate loading region and X is equal to or greater than 25 and equal to or less than 200 wherein X is the number X slots in the substrate loading region.

FIG. 20 shows the relationship between the ULAD and the number the wafers when the wafers are not loaded dispersedly. In FIG. 20, the ULAD value when the large surface area wafers 601 are loaded collectively at the upper portion of the wafer loading region 600 when the number X of the slots of the wafer loading region 600 is equal to or greater than 25 and equal to or less than 200. The advantageous effects of the present embodiment can be obtained by loading the large surface area wafers 601 in a dispersed manner such that the ULAD is adjusted to be smaller than the ULAD indicated in FIG. 20 according to the number X of the slots of the wafer loading region 600.

Figure 21:
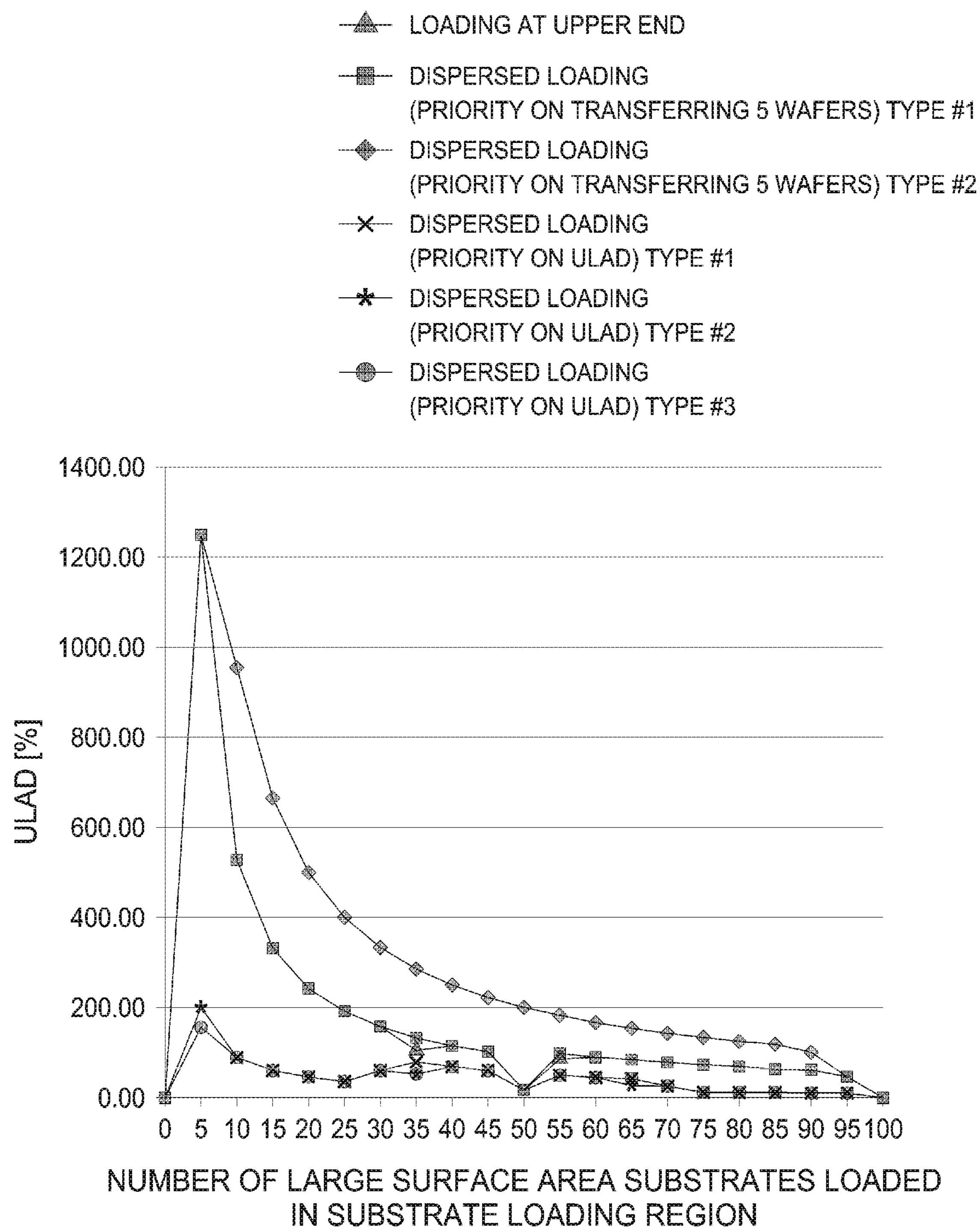
FIG. 21 is a graph showing relationships between the ULAD and the number of the large surface area substrates when the substrates are loaded dispersedly according to various manners and X is 100 wherein X is the number X slots in the substrate loading region.
Figure 22:
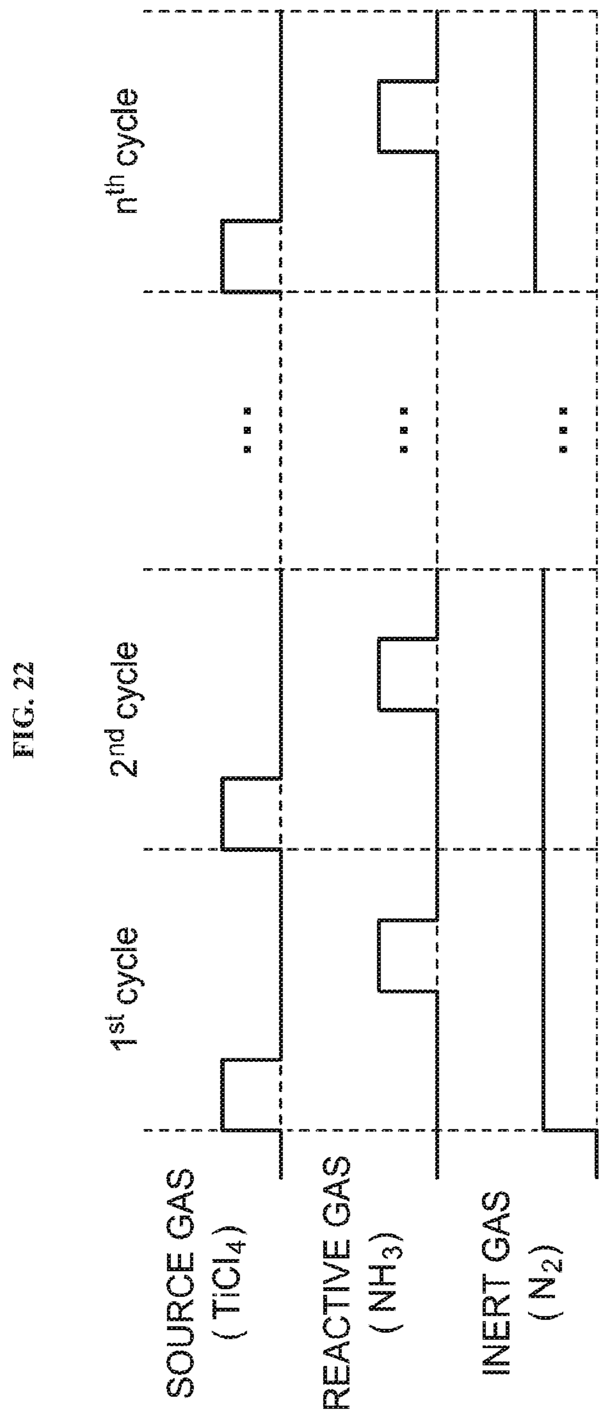
FIG. 22 schematically illustrates a film-forming sequence according to the embodiment.

FIG. 21 shows the ULAD when the large surface area wafers 601 are loaded dispersedly in various manners with the number X of the slots of the wafer loading region 600 is 100. In FIG. 21, "DISPERSED LOADING AT UPPER END" indicates that the large surface area wafers 601 are loaded collectively at the upper end of the wafer loading region 600 instead of being loaded dispersedly.

In FIG. 21, "DISPERSED LOADING (PRIORITY ON TRANSFERRING 5 WAFERS) TYPE #1" and "DISPERSED LOADING (PRIORITY ON TRANSFERRING 5 WAFERS) TYPE #2" indicate that the substrate transfer mechanism (not shown) transfers 5 wafers at a time among the wafers 200 including the large surface area wafers 601 and the fill-dummy wafers 603, and the large surface area wafers 601 are loaded dispersedly as follows, respectively. When the number X of the slots of the wafer loading region 600 is 100 and the number P of the large surface area wafers 601 to be loaded in the wafer loading region 600 is 90, then the number FD of the fill-dummy wafers 603 to be loaded in the wafer loading region 600 is 10. When 5 large surface area wafers 601 are considered as one set, there are 18 sets of the large surface area wafers 601. When 5 fill-dummy wafers 603 are considered as one set, there are 2 sets of the large surface area wafers 601. A basic unit refers to the sum of the number of slots where the fill-dummy wafers 603 are loaded at a time (i.e., the number of the fill-dummy wafers 603 transferred at a time) by the substrate transfer mechanism and the number of slots where the large surface area wafers 601 are loaded at a time (i.e., the number of the large surface area wafers 601 transferred at a time) by the substrate transfer mechanism. That is, a basic unit is constituted by 5 fill-dummy wafers 603 and 5 large surface area wafers 601. When the number P of the large surface area wafers 601 is 90, there are only 2 basic units, and sixteen (16) sets of the large surface area wafers 601 cannot constitute basic units because the number of the fill-dummy wafers 603 is insufficient. In this case, the insufficient fill-dummy wafers 603 are pulled out one by one from each basic unit sequentially from the upper portion of the wafer loading region 600 so as to load the basic units dispersedly. In the embodiment, "DISPERSED LOADING (PRIORITY ON TRANSFERRING 5 WAFERS) TYPE #1" indicates that the large surface area wafers 601 are aligned and loaded at an upper end of the basic unit and "DISPERSED LOADING (PRIORITY ON TRANSFERRING 5 WAFERS) TYPE #2" indicates that the large surface area wafers 601 are aligned and loaded at a lower end of the basic unit.

In FIG. 21, "DISPERSED LOADING (PRIORITY ON ULAD) TYPE #1", "DISPERSED LOADING (PRIORITY ON ULAD) TYPE #2" and "DISPERSED LOADING (PRIORITY ON ULAD) TYPE #3" indicate that the improvement of ULAD is prioritized, thus the number of wafers transferred by the substrate transfer mechanism (not shown) is not predetermined. According to "DISPERSED LOADING (PRIORITY ON ULAD) TYPE #1", "DISPERSED LOADING (PRIORITY ON ULAD) TYPE #2" and "DISPERSED LOADING (PRIORITY ON ULAD) TYPE #3", the large surface area wafers 601 are loaded dispersedly as follows, respectively. When the number P of the large surface area wafers 601 to be loaded in the wafer loading region 600 is 90, then the number FD of the fill-dummy wafers 603 to be loaded in the wafer loading region 600 is 10. Then, the ratio of P to FD is 9.0, and a basic unit is constituted by 1 fill-dummy wafer 603 and 9 large surface area wafers 601. When the number P is 90 and the number FD is 10, 10 basic units are constituted by the fill-dummy wafers 603 and the large surface area wafers 601, and none of the fill-dummy wafers 603 and the large surface area wafers 601 is remained without constituting the basic set. When some of the fill-dummy wafers 603 and the large surface area wafers 601 are remained without constituting the basic set, for example, when the number P is 85 and the number FD is 10, 5 fill-dummy wafers 603 are insufficient to constituting the basic sets. In this case, the large surface area wafers 601 are pulled out one by one from the basic units sequentially from the lower portion of the wafer loading region 600 so as to load the basic units dispersedly. In the embodiment, "DISPERSED LOADING (PRIORITY ON ULAD) TYPE #1" indicates that the large surface area wafers 601 are aligned and loaded at an upper end of the basic unit, "DISPERSED LOADING (PRIORITY ON ULAD) TYPE #2" indicates that the large surface area wafers 601 are aligned and loaded at a lower end of the basic unit, and "DISPERSED LOADING (PRIORITY ON ULAD) TYPE #3" indicates that the large surface area wafers 601 are aligned and loaded at a center portion of the basic unit.

According to each of the disperse loading methods described above, a lower ULAD is obtained as compared with the case when the large surface area wafers 601 are loaded collectively (not loaded dispersedly).

Next, a method of forming a film having a desired thickness will be described. According to the method, a film having a desired thickness can be formed by automatically correcting a rate of reduction of the average film thickness between the wafers 200 is decreased as the large surface area wafers 601 are loaded in the wafer loading region 600. For example, by automatically correcting the rate, even if the total surface area of the large surface area wafers 601 loaded in the wafer loading region 600 varies with each batch, it is possible to form the film with a constant thickness.

FIG. 8 is a graph showing thickness distributions of films in the wafer loading region 600 by normalized film thicknesses. Referring to FIG. 8, when the large surface area wafers 601 are loaded, even when the large surface area wafers 601 are loaded dispersedly, the film thicknesses decreases in the wafer loading region 600 compared with the case when no large surface area wafer 601 is loaded in the wafer loading region 600. As the surface area of each large surface area wafer 601 increases, the amount of the film thickness reduction increases. Further, as the number of the large surface area wafers 601 loaded in the wafer loading region 600 increases, the amount of the film thickness reduction increases. That is, as a total surface area of the large surface area wafers 601 increases, the amount of the film thickness reduction increases. Therefore, a film having a desired thickness can be formed on the wafers 200 to be processed by obtaining in advance the relationship between the total surface area of the large surface area wafers 601 and the amount of the film thickness reduction and correcting the number of times of the cycles for alternately supplying a plurality of process gases. That is, even if the total surface area of the large surface area wafers 601 varies with each batch, it is possible to form a film having a constant film thickness on the wafers 200 to be processed without being affected by the change of the total surface area.

Specifically, the total surface area is obtained by multiplying the surface area of each large surface area wafer 601 by the number of the large surface area wafers 601 to be loaded in the wafer loading region 600. The relationship between the total surface area and the amount of the film thickness reduction is obtained in advance. The additional number of times of the cycle forming the film having the desired film thickness is obtained in advance. Accordingly, a correlation table of the total surface area and the additional number of times of the cycle can be created. According to the embodiment, the controller has a function of determining the number of times of the cycle forming the film. Specifically, when the film-forming process described later is started, the surface area of each large surface area wafer 601 is inputted to the controller 121 by the input/output device 122 in advance and the number of the large surface area wafers 601 loaded in the wafer loading region 600 is automatically recognized by the controller 121. The total surface area of the large surface area wafers 601 is automatically calculated by the controller 121. The controller determines the number of times of the cycle appropriately by automatically reading the additional number of times of the cycle from the correlation table. Therefore, it is possible to form a film having a desired thickness on the substrate to be processed (i.e., the wafers 200) without being affected by the total surface area of the large surface area wafers 601.

Alternatively, a correlation table of the additional number of times of the cycle may be created only by the relationship between the number of large surface area wafers 601 and the amount of the film thickness reduction, and the correlation table may be prepared for different surface areas of each large surface area wafer 601. In this case, when the film-forming process described later is started, according to the surface area of each large surface area wafer 601 to be processed, a correlation table of the additional number of times of the cycle is designated from the input/output device 122 to the controller 121 (similar to designating a recipe described late by the controller 121). The number of the large surface area wafers 601 loaded in the wafer loading region 600 is automatically recognized by the controller 121. The same effect as described above can be obtained according to this case.

(3) Film-Forming Process

Next, an exemplary sequence of forming films on the wafers 200, which is a part of the substrate processing for manufacturing a semiconductor device, using the substrate processing apparatus 10 will be described with reference to FIG. 23. Herein, the components of the substrate processing apparatus 10 are controlled by the controller 121.

In this specification, "wafer" may refer to "a wafer itself" or refer to "a wafer and a stacked structure (aggregated structure) of predetermined layers or films formed on the surface of the wafer". In this specification, "surface of wafer" refers to "a surface (exposed surface) of" a wafer itself or "the surface of a predetermined layer or film formed on the wafer, i.e. the top surface of the wafer as a stacked structure".

Thus, in this specification, "supplying a predetermined gas onto a wafer" may refer to "supplying a predetermined gas onto a surface (exposed surface) of the wafer itself" or refer to "supplying a predetermined gas onto patterns such as a layer and a film formed on the wafer", i.e. "supplying a predetermined gas onto a top surface of the wafer as a stacked structure". In this specification, "forming a predetermined layer (or film) on a wafer" may refer to "forming a predetermined layer (or film) on a surface (exposed surface) of the wafer itself" or refer to "forming a predetermined layer (or film) on a surface of a layer or a film formed on the wafer", i.e. "forming a predetermined layer (or film) on a top surface of the wafer as a stacked structure".

In this specification, "wafer" is an example of a "substrate." Hereinafter, a method of manufacturing a semiconductor device according to the embodiment will be described in detail.

Wafer Charging and Boat Loading Step

After the wafers 200 are loaded (charged) into the boat 217 (wafer charging), the shutter **219*s* is moved by the shutter opening/closing mechanism 115*s* and the lower end opening of the manifold 209 is opened (shutter opening). As shown in FIG. 1, the boat 217 charged with the wafers 200 is lifted by the boat elevator 115 and loaded into the process chamber 201 (boat loading). With the boat 217 loaded, the seal cap 219 seals the lower end of the manifold 209 through the O-ring 220***b*.

Pressure and Temperature Adjusting Step

The vacuum pump 246 vacuum-exhausts the process chamber 201 such that the inner pressure of the process chamber 201, that is, the pressure of the space in which the wafers 200 are present is set to a desired pressure (vacuum degree). The inner pressure of the process chamber 201 is measured by the pressure sensor 245, and the APC valve 243 is feedback controlled based on the measured pressure (pressure adjusting). Until at least the process for the wafers 200 is completed, the vacuum pump 246 continuously exhausts the process chamber 201. The heater 207 heats the process chamber 201 such that the internal temperature of the process chamber 201 becomes a desired temperature. The amount of electricity conducted to the heater 207 is feedback controlled based on the temperature detected by the temperature sensor 263, such that the internal temperature of the process chamber 201 has a desired temperature distribution (temperature adjusting). Until at least the process for the wafers 200 is completed, the heater 207 continuously heats the process chamber 201. Thereafter, the rotating mechanism 267 starts to rotate the boat 217 and the wafers 200. Until at least the process for the wafers 200 is completed, the rotating mechanism 267 continuously rotates the boat 217 and the wafers 200.

Film-Forming Step

Next, the film-forming step is performed by performing a source gas supply step, a first residual gas removing step, a reactive gas supply step and a second residual gas removing step sequentially.

Source Gas Supply Step

The valve 314 is opened to supply the $TiCl_4$ gas into the gas supply pipe 310. After the flow rate of the $TiCl_4$ gas is adjusted by the MFC 312, the $TiCl_4$ gas is supplied onto the wafers 200 through the plurality of gas supply holes 410*a* of the nozzle 410. That is, the wafers 200 are exposed to the $TiCl_4$ gas. Then, the $TiCl_4$ gas is exhausted through the exhaust pipe 231. Simultaneously, the valve 514 may be opened to supply $N_2$ gas serving as a carrier gas into the gas supply pipe 510. After the flow rate of the $N_2$ gas is adjusted by the MFC 512, the $N_2$ gas is supplied with the $TiCl_4$ gas into the process chamber 201 through the plurality of gas supply holes 410*a* of the nozzle 410, and exhausted through the exhaust pipe 231.

In order to prevent the $TiCl_4$ gas from entering the nozzle 420, the valve 524 may be opened to supply $N_2$ gas into the gas supply pipe 520. The $N_2$ gas is supplied into the process chamber 201 through the gas supply pipe 520 and the nozzle 420, and exhausted through the exhaust pipe 231.

In the source gas supply step, the APC valve 243 is controlled to adjust the inner pressure of the process chamber 201. For example, the inner pressure of the process chamber 201 may range from 1 Pa to 1,330 Pa, preferably from 10 Pa to 931 Pa, more preferably from 20 Pa to 399 Pa. When the inner pressure of the process chamber 201 is higher than 1,330 Pa, a residual gas may not be sufficiently purged. As a result, by-products may be taken into the film and the resistance of the film increases. When the inner pressure of the process chamber 201 is lower than 1 Pa, sufficient reaction rate of the $TiCl_4$ cannot be obtained. In this specification, "from 1 Pa to 1,000 Pa" refers to "1 Pa or higher and 1,000 Pa or lower." That is, the range "from 1 Pa to 1,000 Pa" includes 1 Pa and 1,000 Pa. The same also applies to other numerical ranges herein such as flow rate, time and temperature.

For example, the flow rate of the $TiCl_4$ gas adjusted by the MFC 312 may range from 0.01 slm to 1.0 slm, preferably from 0.1 slm to 0.7 slm, more preferably from 0.2 slm to 0.5 slm. When the flow rate of the $TiCl_4$ gas adjusted by the MFC 312 is higher than 1.0 slm, the TiCl4 gas may be reliquefied in the gas supply pipe 310. When the flow rate of the $TiCl_4$ gas adjusted by the MFC 312 is lower than 0.01 slm, the throughput may deteriorate.

For example, the flow rate of the $N_2$ gas is adjusted by the MFC 512 such that the total flow rate in the nozzle 410 may range from 0.01 slm to 50 slm, preferably from 0.1 slm to 20 slm, more preferably from 0.2 slm to 10 slm. For example, the flow rate of the $N_2$ gas adjusted by the MFC 512 may range from 0 slm to 49 slm, preferably from 0 slm to 19.3 slm, more preferably from 0 slm to 9.5 slm. When the total flow rate in the nozzle 410 is higher than 50 slm, the gas adiabatically expands in the plurality of gas supply holes 410*a* and may be reliquefied. When the flow rate of the $TiCl_4$ gas is lower than that of the desired throughput, the flow rate of the $N_2$ gas may be increased. By supplying the $N_2$ gas, the $TiCl_4$ gas supplied through the plurality of gas supply holes 410*a* can be uniformly supplied onto the wafers 200.

The time duration of supplying the $TiCl_4$ gas onto the wafers 200 may range from 1 second to 300 seconds, preferably from 1 second to 60 seconds, and more preferably from 1 second to 10 seconds. When the time duration of supplying the $TiCl_4$ gas is longer than 300 seconds, the throughput may deteriorate and the operation cost may increase. When the time duration of supplying the $TiCl_4$ gas is shorter than 1 second, the exposure amount of the $TiCl_4$ gas required for the film-forming may not be sufficiently obtained.

For example, the heater 207 heats the process chamber 201 such that the temperature of the wafers 200 may range from 200° C. to 700° C., preferably 300° C. to 600° C., more preferably 380° C. to 525° C. When the temperature of the wafers 200 is higher than 700° C., the thermal budget becomes a value outside the allowable range. When the temperature of the wafers 200 is lower than 200° C., the reactivity is low and the film may not be formed.

By supplying the $TiCl_4$ gas into the process chamber 201 under the above-described conditions, a titanium-containing layer is formed on the top surface of the wafer 200.

First Residual Gas Removing Step

After the titanium-containing layer is formed on the wafers 200, the valve 314 is closed to stop the supply of the $TiCl_4$ gas. With the APC valve 243 open, the vacuum pump 246 vacuum-exhausts the inside of the process chamber 201 to remove residual $TiCl_4$ gas which did not react or which contribute to the formation of the titanium-containing layer from the process chamber 201. By maintaining the valves 514 and 524 open, the $N_2$ gas is continuously supplied into the process chamber 201. The $N_2$ gas acts as a purge gas, which improves the efficiency of removing the residual $TiCl_4$ gas which did not react or which contribute to the formation of the titanium-containing layer from the process chamber 201.

Reactive Gas Supply Step

After the residual gas in the process chamber 201 is removed, the valve 324 is opened to supply the $NH_3$ gas into the gas supply pipe 320. After the flow rate of the $NH_3$ gas is adjusted by the MFC 322, the $NH_3$ gas is supplied onto the wafers 200 through the plurality of gas supply holes 420*a* of the nozzle 420. That is, the wafers 200 are exposed to the $NH_3$ gas. Then, the $NH_3$ gas is exhausted through the exhaust pipe 231. Simultaneously, the valve 524 may be opened to supply the $N_2$ gas into the gas supply pipe 520. After the flow rate of the $N_2$ gas is adjusted by the MFC 522, the $N_2$ gas is supplied with the $NH_3$ gas into the process chamber 201 through the plurality of gas supply holes 420*a* of the nozzle 420, and exhausted through the exhaust pipe 231. In order to prevent the $NH_3$ gas from entering the nozzle 410, the valve 514 may be opened to supply the $N_2$ gas into the gas supply pipe 510. The $N_2$ gas is supplied into the process chamber 201 through the gas supply pipe 510 and the nozzle 410, and exhausted through the exhaust pipe 231.

In the reactive gas supply step, the APC valve 243 is controlled to adjust the inner pressure of the process chamber 201. For example, the inner pressure of the process chamber 201 may range from 1 Pa to 1,330 Pa, preferably from 10 Pa to 2,660 Pa, more preferably from 20 Pa to 1,330 Pa. When the inner pressure of the process chamber 201 is higher than 1,330 Pa, a time for performing the second residual gas removing step described later is increased and the throughput may deteriorate. When the inner pressure of the process chamber 201 is lower than 1 Pa, the exposure amount of the $NH_3$ gas required for the film-forming may not be sufficiently obtained.

For example, the flow rate of the $NH_3$ gas adjusted by the MFC 322 may range from 1 slm to 50 slm, preferably from 3 slm to 20 slm, more preferably from 5 slm to 10 slm. When the flow rate of the $NH_3$ gas adjusted by the MFC 322 is higher than 50 slm, the time for performing the second residual gas removing step described later is increased and the throughput may deteriorate. When the flow rate of the $NH_3$ gas adjusted by the MFC 322 is lower than 1 slm, the exposure amount of the $NH_3$ gas required for the film-forming may not be sufficiently obtained.

For example, the flow rate of the $N_2$ gas is adjusted by the MFC 522 such that the total flow rate in the nozzle 420 may range from 1 slm to 50 slm, preferably from 3 slm to 20 slm, more preferably from 5 slm to 10 slm. For example, the flow rate of the $N_2$ gas adjusted by the MFC 522 may range from 0 slm to 49 slm, preferably from 0 slm to 17 slm, more preferably from 0 slm to 9.5 slm. When the total flow rate in the nozzle 420 is higher than 50 slm, the time for performing the second residual gas removing step described later is increased and the throughput may deteriorate. When the total flow rate in the nozzle 420 is lower than 1 slm, the exposure amount of the $NH_3$ gas required for the film-forming may not be sufficiently obtained.

The time duration of supplying the $NH_3$ gas onto the wafers 200 may range from 1 second to 120 seconds, preferably from 5 second to 60 seconds, and more preferably from 5 second to 10 seconds. When the time duration of supplying the $NH_3$ gas is longer than 120 seconds, the throughput may deteriorate and the operation cost may increase. When the time duration of supplying the $NH_3$ gas is shorter than 1 second, the exposure amount of the $NH_3$ gas required for the film-forming may not be sufficiently obtained. The other process conditions of the reactive gas supply step are the same as those of the above-described source gas supply step.

In the reactive gas supply step, only the $NH_3$ gas and the inert gas ($N_2$ gas) are supplied into the process chamber 201. The $NH_3$ gas reacts with at least a portion of the titanium-containing layer formed on the wafers 200 in the source gas supply step to form a titanium nitride layer (TiN layer) containing titanium (Ti) and nitrogen (N). That is, the titanium-containing layer is modified into the TiN layer.

Second Residual Gas Removing Step

After the TiN layer is formed, the valve 324 is closed to stop the supply of the $NH_3$ gas. Residual $NH_3$ gas which did not react or which contribute to the formation of the TiN layer and reaction by-products remaining in the process chamber 201 are exhausted from the process chamber 201 in the same manner as in the first residual gas removing step.

Performing Predetermined Number of Times

By performing a cycle wherein the source gas supply step, the first residual gas removing step, the reactive gas supply step and the second residual gas removing step are performed non-simultaneously in order a predetermined number of times (one or more times), a titanium nitride film (TiN film) is formed on the wafer 200. The predetermined number of times is appropriately selected according to the target thickness of the TiN film. However, it is preferable that the cycle is performed a plurality of times. For example, the target thickness of the TiN film may range from 0.5 nm to 3 μm, preferably from 0.8 nm to 2 μm, more preferably from 1 nm to 1 μm. By setting the target thickness of the TiN film to 3 m or less, it is possible to prevent the adhesion between the boat 217 and the wafer 200 by the TiN film (deposited film) formed on the wafer 200. By setting the target thickness of the TiN film to 0.5 nm or more, it is possible to form a continuous TiN film because gaps generated by the formation of TiN in an island shape at the initial stage of the film-forming is almost removed.

Purging and Returning to Atmospheric Pressure Step

After the film-forming step is completed, the valves 514 and 524 are opened to supply the $N_2$ gas. The $N_2$ gas is supplied into the process chamber 201 through each of the gas supply pipes 310 and 320, and then exhausted through the exhaust pipe 231. The $N_2$ gas acts as a purge gas. The gas or the reaction by-products remaining in the process chamber 201 are removed from the process chamber 201 (purging). Thereafter, the inner atmosphere of the process chamber 201 is replaced with the inert gas (substitution by $N_2$ gas), and the inner pressure of the process chamber 201 is returned to atmospheric pressure (returning to atmospheric pressure).

Boat Unloading and Wafer Discharging Step

Thereafter, the seal cap 219 is lowered by the boat elevator 115 and the lower end of the manifold 209 is opened. The boat 217 with the processed wafers 200 charged therein is unloaded from the reaction tube 203 through the lower end of the manifold 2093 (boat unloading). After the boat is unloaded, the shutter 219*s* is moved. The lower end of the manifold 209 is sealed by the shutter 219*s* through the O-ring 220*c* (shutter closing). The processed wafers 200 are taken out of the reaction tube 203 and then unloading (discharged) from the boat 217 (wafer discharging).

Effects According to the Embodiment

According to the embodiment, one or more advantageous effects described below are provided.

(a) When loading and processing less than X number of large surface area substrates by using a batch processing apparatus provided with a substrate loading region capable of loading X wafers (herein, X is a natural number equal to or greater than three and represents the maximum number of the substrates can be loaded in the substrate loading region), a density distribution of the large surface area substrate in the substrate loading region can be flattened by loading large surface area substrates dispersedly in the substrate loading region. Thus, it is possible to improve the thickness uniformity between the films formed on the substrates in the substrate loading region.

(b) When loading and processing less than X number of large surface area substrates by using a batch processing apparatus provided with a substrate loading region capable of loading X wafers (X is a natural number equal to or greater than three), the large surface area substrate are loaded dispersedly such that a uniformity of the density distribution of the large surface area substrate is small compared with the case where the large surface area substrate are collectively loaded (i.e., not loaded dispersedly). When $25 \leq X \leq 200$, the uniformity of the density distribution of the large surface area substrate is calculated based on the average of the large surface area substrate density values of a total of 11 slots including a given slot and 10 slots closest to the slot. When $11 \leq X \leq 24$, the uniformity of the density distribution of the large surface area substrate is calculated based on the average of the large surface area substrate density values of a total of 5 slots including a given slot and 4 slots closest to the slot. When $5 \leq X \leq 10$, the uniformity of the density distribution of the large surface area substrate is calculated based on the average of the large surface area substrate density values of a total of 3 slots including a given slot and 2 slots closest to the slot. Thus, the density distribution of the large surface area substrate in the substrate loading region can be further flattened.

(c) It is possible to improve a uniformity of the density distribution of the subgroups of large surface area substrate by increasing the number of the subgroups of the large surface area substrates as many as possible (i.e., reducing the number of the large surface area substrates included in a single subgroup of the large surface area substrates), as long as the number of the substrates does not exceed the number of the slots in the substrate loading region.

(d) By increasing a distance between two closest subgroups of the large surface area substrates or the number of slots where the large surface area substrates are not loaded, as long as the number of the substrates does not exceed the number of the slots in the substrate loading region, the density distribution of the large surface area substrate in the substrate loading region can be further flattened.

(e) When a substrate transfer mechanism having a function of suitably selecting an operation mode between a single substrate transfer mode (i.e., a mode for transferring a substrate individually at a time) and a 5-substrates batch transfer mode (i.e., a mode for transferring a total of 5 substrates at a time) is used to transfer the substrates, the large surface area substrates may be loaded in a dispersed manner according to such substrate loading pattern that maximizes the number of using the 5-substrates batch transfer mode to flatten the density distribution of large surface area substrate in the substrate loading region compared with the case where the large surface area substrate are collectively loaded (i.e., not loaded dispersedly). In this manner, it is possible to improve the uniformity of the density distribution of large surface area substrate while shortening the transfer time required for transferring the large surface area substrates.

(f) When inserting monitor substrates into the substrate loading region, by keeping the distance between each monitor substrate and the large surface area substrate closest thereto to be constant, the amount of reduction in the film thickness due to the distances between each monitor substrate and the large surface area substrates can be adjusted to be equal or nearly equal between the substrates in the substrate loading region. Thus, it possible to improve the easiness of the assessment and the management of the uniformity of the film thickness between the substrates in the substrate loading region using the monitor substrates.

(g) When the batch processing apparatus provided with the substrate loading region capable of loading X wafers (X is a natural number equal to or greater than three) is used to process the large surface area substrates less than X, by inputting a surface area of a single large surface area substrate in advance, the number of times of the cycles for alternately supplying a plurality of process gases can be automatically corrected based on a total surface area of the large surface area substrates changed by at least one of a surface area of a single large surface area substrate and the number of the large surface area substrates loaded in the substrate loading region. Thus, it is possible to form a film having a constant film thickness on the large surface area substrates even if the total surface area of the large surface area substrates varies with each batch.

(h) When the large surface area substrates are processed by the batch processing apparatus, the influence of at least one of the surface area of the single large surface area substrate and the number of the large surface area substrates loaded in the substrate loading region can be reduced. Thus, it is possible to achieve the uniformity of the film thickness between the substrates in the substrate loading region with appropriate value, and to form a film having a desired thickness on the substrates to be processed.

Other Embodiments

While the technique is described by way of the above-described embodiment and examples, the above-described technique is not limited thereto. The above-described technique may be modified in various ways without departing from the gist thereof.

For example, according to the above-described embodiment, the $TiCl_4$ gas is used as the titanium-containing gas. However, the above-described technique is not limited thereto. Instead of the $TiCl_4$ gas, for example, various gases such as tetrakis dimethylamino titanium ($Ti[N(CH_3)_2]_4$, abbreviated as TDMAT), tetrakis diethylamino titanium ($Ti[N(CH_2CH_3)_2]_4$, abbreviated as TDEAT) and titanium tetraiodide ($TiI_4$) may be used as the titanium-containing gas. According to the above-described embodiment, the $NH_3$ gas is used as the nitrogen-containing gas. However, the above-described technique is not limited thereto. Instead of the $NH_3$ gas, for example, various gases such as $N_2$, nitrous oxide (NO) and nitrogen oxide ($N_2O$) may be used as the nitrogen-containing gas. Further, various gases such hydrazine, monomethylhydrazine, dimethylhydrazine, trimethylamine, dimethylamine, monomethylamine, triethylamine, diethylamine and monoethylamine may be used as the nitrogen-containing gas. According to the above-described embodiment, the $N_2$ gas is used as the inert gas. However, the above-described technique is not limited thereto. Instead of the $N_2$ gas, for example, rare gases such as argon (Ar) gas, helium (He) gas, neon (Ne) gas, krypton (Kr) gas and xenon (Xe) gas may be used as the inert gas.

While the above-described embodiment is described based on forming the titanium nitride film (TiN film) on the substrate, the above-described technique is not limited thereto. According to the embodiment, titanium (Ti), which is a transition metal, is exemplified as an element constituting the film. However, the above-described technique is not limited thereto. For example, an element such as zirconium (Zr), hafnium (Hf), tantalum (Ta), ruthenium (Ru), niobium (Nb), molybdenum (Mo), tungsten (W), yttrium (Y), lanthanum (La) and nickel (Ni) may be used instead of titanium. Further, a metal element other than transition metal such as strontium (Sr) and silicon (Si) may be used instead of titanium. For example, the above-described technique may be applied to the formations of a film containing at least one of the above-described elements such as a nitride film, a carbonitride film, an oxide film, an oxycarbide film, an oxynitride film, an oxycarbonitride film, a boron nitride film, a boron carbonitride film and a metal element film.

For example, according to the above-described embodiment, the processing furnace having a single-tube structure (i.e., the reaction tube 203) is used. However, the above-described technique is not limited thereto. For example, the above-described technique may also be applied when a processing furnace having a double-tube structure (i.e., an inner tube and an outer tube) is used to perform the film-forming process. Since nozzles for supplying the process gases extend from bottom to top of an inner wall of the inner tube and an exhaust port is provided at the inner wall of the inner tube opposite to the substrate, the process gases are more easily supplied onto the substrate. Thus, it is possible to improve the uniformity of the thickness of the film formed on the surface of the substrate.

The recipe used for the film-forming process (program containing information on the sequence and conditions of the film-forming process) are preferably prepared individually according to the process contents such as type of film to be formed or to be removed, composition ratio of the film, the quality the film, the thickness of the film, the process sequences and process conditions, and stored in the memory device 121*c* via an electric communication line or the external memory device 123. When starting the film-forming process, the CPU 121*a* preferably selects an appropriate recipe between the plurality of recipe stored in the memory device 121*c* according to the contents of the film-forming process. Thus, various films having different composition ratios, different qualities and different thicknesses may be formed at high reproducibility using a single substrate processing apparatus. Further, since the burden on the operator such as inputting the processing sequences and the processing conditions may be reduced, various processes may be performed quickly while avoiding a malfunction of the apparatus.

The above-described recipe is not limited to creating a new recipe. For example, the recipe may be prepared by changing an existing recipe stored in the substrate processing apparatus in advance. When changing the existing recipe to a new recipe, the new recipe may be installed in the substrate processing apparatus via the electric communication line or the recording medium in which the new recipe is stored. The existing recipe already stored in the substrate processing apparatus may be directly changed to a new recipe by operating the input/output device 122 of the substrate processing apparatus.

The above-described embodiment and the modified examples may be appropriately combined. The processing sequences and the processing conditions of the combinations may be substantially the same as those of the above-described embodiment.

According to the technique described herein, the controllability of a thickness of a film formed on a large surface area substrate having a surface area greater than a surface area of a bare substrate can be improved and the thickness uniformity between films formed on a plurality of large surface area substrates accommodated in a substrate loading region can be improved by reducing the influence of the surface area of the large surface area substrate and the number of the large surface area substrates due to a loading effect even when the plurality of large surface area substrates are batch-processed using a batch type processing furnace.

What is claimed is:

1. A method of manufacturing a semiconductor device using a substrate retainer comprising a substrate loading region provided with a plurality of slots and capable of loading and holding a maximum of X (X is a natural number equal to or greater than 3) substrates in the plurality of slots, the method comprising:

(a) when loading dispersedly Y (Y is a natural number less than X and equal to 19) product substrates whose surface area is larger than that of a bare substrate in the substrate retainer where a substrate transfer mechanism having a function of suitably selecting an operation mode between a single substrate transfer mode and a 5-substrates batch transfer mode, loading Z (Z is a natural number less than Y, and indicates a maximum number of the product substrates loaded in a consecutive manner) product substrates in a consecutive manner in the substrate retainer one or more times such that a density distribution of the product substrates in the substrate loading region is more flattened compared with the density distribution of the product substrates when Z is equal to Y; and (b) processing the Y product substrates loaded in the plurality of slots.

2. The method of claim 1, wherein, when X is equal to or greater than 25 and equal to or less than 200, Z is adjusted such that a density distribution of the product substrate of every 11 slots consisting of a given slot and 10 slots closest thereto is more flattened compared with the density distribution of the product substrates in the substrate loading region when Z is equal to Y.

3. The method of claim 1, wherein, when X is equal to or greater than 11 and equal to or less than 24, a density distribution of the product substrate of every 5 slots consisting of a given slot and 4 slots closest thereto is more flattened compared with the density distribution of the product substrates in the substrate loading region when Z is equal to Y.

4. The method of claim 1, wherein, when X is equal to or greater than 5 and equal to or less than 10, a density distribution of the product substrate of every 3 slots consisting of a given slot and 2 slots closest thereto is more flattened compared with the density distribution of the product substrates in the substrate loading region when Z is equal to Y.

5. The method of claim 1, wherein a film having a predetermined thickness is formed on surfaces of the product substrates by performing a cycle a predetermined number of times in (b), the cycle comprising supplying a plurality of process gases to the process chamber without mixing the plurality of process gases.

6. The method of claim 1, wherein the product substrates are large surface area substrates comprising patterns formed on upper surfaces thereof, wherein each of the large surface area substrates is a substrate whose surface area is larger than or equal to $3\pi r^2$ where r is a radius thereof.

7. The method of claim 1, wherein the film having the predetermined thickness is formed on the product substrates by correcting the predetermined number of times according to a total surface area of the product substrates loaded in the substrate loading region, the total surface area being obtained by multiplying an upper surface area of each of the product substrates and the number Y.

8. The method of claim 1, wherein at least one among a fill-dummy substrate and a monitor substrate is loaded in (X-Y) slots where the product substrates are not loaded.

9. The method of claim 1, wherein a plurality of monitor substrates are respectively loaded in a plurality of slots where the product substrates are not loaded such that distances between the plurality of monitor substrates and the plurality of slots where the product substrates are loaded are the same.

10. A method of manufacturing a semiconductor device using a substrate retainer comprising a substrate loading region provided with a plurality of slots and capable of loading and holding a maximum of X (X is a natural number equal to or greater than 3) substrates in the plurality of slots, the method comprising:

(a) when loading dispersedly Y (Y is a natural number less than X and equal to 19) substrates having patterns formed thereon and having surface area larger than that of a bare substrate in the substrate retainer where a substrate transfer mechanism having a function of suitably selecting an operation mode between a single substrate transfer mode and a 5-substrates batch transfer mode, loading Z (Z is a natural number less than Y, and indicates a maximum number of the product substrates loaded in a consecutive manner) product substrates in a consecutive manner in the substrate retainer one or more times such that a density distribution of surface area of the substrates having patterns formed thereon in the substrate loading region is more flattened compared with the density distribution of surface area of the substrates having patterns formed thereon when Z is equal to Y; and (b) processing the Y substrates having patterns formed thereon and loaded in the plurality of slots.

11. The method of claim 10, wherein the product substrates are large surface area substrates comprising patterns formed on upper surfaces thereof, wherein each of the large surface area substrates is a substrate whose surface area is larger than or equal to 37rr2 where r is a radius thereof.

12. The method of claim 10, wherein at least one among a fill-dummy substrate and a monitor substrate is loaded in (X-Y) slots where the product substrates are not loaded.

13. The method of claim 10, wherein a plurality of monitor substrates are respectively loaded in a plurality of slots where the product substrates are not loaded such that distances between the plurality of monitor substrates and the plurality of slots where the product substrates are loaded are the same.

* * * * *